US012787212B2

(12) United States Patent
Kim et al.

(10) Patent No.: US 12,787,212 B2
(45) Date of Patent: Nov. 3, 2026

(54) STORAGE DEVICE COOLING AIR VENTILATION FEATURES

(71) Applicant: Sandisk Technologies, Inc., Milpitas, CA (US)

(72) Inventors: MyungJin Kim, Santa Clara, CA (US); Fu Xing Chan, Penang (MY); Li Chen, Sunnyvale, CA (US); Daniel Oh, San Jose, CA (US); Leroy Fong, Irvine, CA (US); Hedan Zhang, Santa Clara, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 226 days.

(21) Appl. No.: 18/583,458

(22) Filed: Feb. 21, 2024

(65) Prior Publication Data

US 2025/0267817 A1 Aug. 21, 2025

(51) Int. Cl.

*H05K 7/20* (2006.01)
*G06F 1/20* (2006.01)
*H05K 5/00* (2025.01)

(52) U.S. Cl.

CPC ........... *H05K 7/20145* (2013.01); *G06F 1/20* (2013.01); *H05K 5/0026* (2013.01); *H05K 7/2039* (2013.01)

(58) Field of Classification Search

CPC ..... H05K 7/20145; H05K 5/0026; G06F 1/20
See application file for complete search history.

(56) References Cited

U.S. PATENT DOCUMENTS 5,694,294 A * 12/1997 Ohashi .................... G06F 1/203 361/679.48
6,249,434 B1 * 6/2001 Scafidi ............... H05K 7/20445 361/174
9,400,532 B2 7/2016 Kwon et al.
9,411,383 B2 * 8/2016 Gong ...................... G06F 1/181
(Continued)

FOREIGN PATENT DOCUMENTS

WO WO2018169545 A1 9/2018
WO WO2019061361 A1 4/2019

OTHER PUBLICATIONS

Yuan, Dongdong et al., Thermal Performance of the Thin Heat Pipe for Cooling of Solid-State Drives, Metals 2022, 12, 1786, Received: Sep. 8, 2022, Accepted: Oct. 21, 2022, Published: Oct. 23, 2022, pp. 1-14, MDPI.

*Primary Examiner* — Jayprakash N Gandhi
*Assistant Examiner* — Matthew Sinclair Muir
(74) *Attorney, Agent, or Firm* — Dentons Durham Jones Pinegar

(57) ABSTRACT

In the context of an electronic device such as a solid-state storage drive, use of an enclosure cover including an inlet port through a first lateral sidewall and a corresponding cooling duct coincident with first inlet port enables directing of airflow laterally to below the cover to a printed circuit board housed therein. To further augment device cooling within specification-dictated restrictions, a row of ventilation slots may be used for directing additional lateral airflow over the outer surface of the cover. Still further, interfacing tooth structures in the cover and corresponding base enable cost-effective end-to-end airflow through the device by avoiding machining steps during manufacturing, while still mitigating risk of electrostatic discharge.

20 Claims, 16 Drawing Sheets

(56) References Cited

U.S. PATENT DOCUMENTS

| | | | | |
|---|---|---|---|---|
| 9,497,891 | B2 | 11/2016 | Alvarado et al. | |
| 9,839,161 | B2 | 12/2017 | Embleton et al. | |
| 11,317,540 | B2 * | 4/2022 | Hur | H05K 1/0203 |
| 11,429,163 | B2 | 8/2022 | Xiong et al. | |
| 11,604,495 | B2 | 3/2023 | Beall et al. | |
| 2006/0104025 | A1 * | 5/2006 | Wabiszczewicz | H05K 7/20154 361/694 |
| 2014/0376174 | A1 | 12/2014 | Dean et al. | |
| 2019/0215972 | A1 * | 7/2019 | Jang | G06F 1/181 |
| 2020/0260602 | A1 * | 8/2020 | Gao | H05K 7/20418 |
| 2022/0030742 | A1 * | 1/2022 | Rehak | H05K 7/20154 |
| 2022/0344243 | A1 * | 10/2022 | Hur | G06F 1/20 |

* cited by examiner

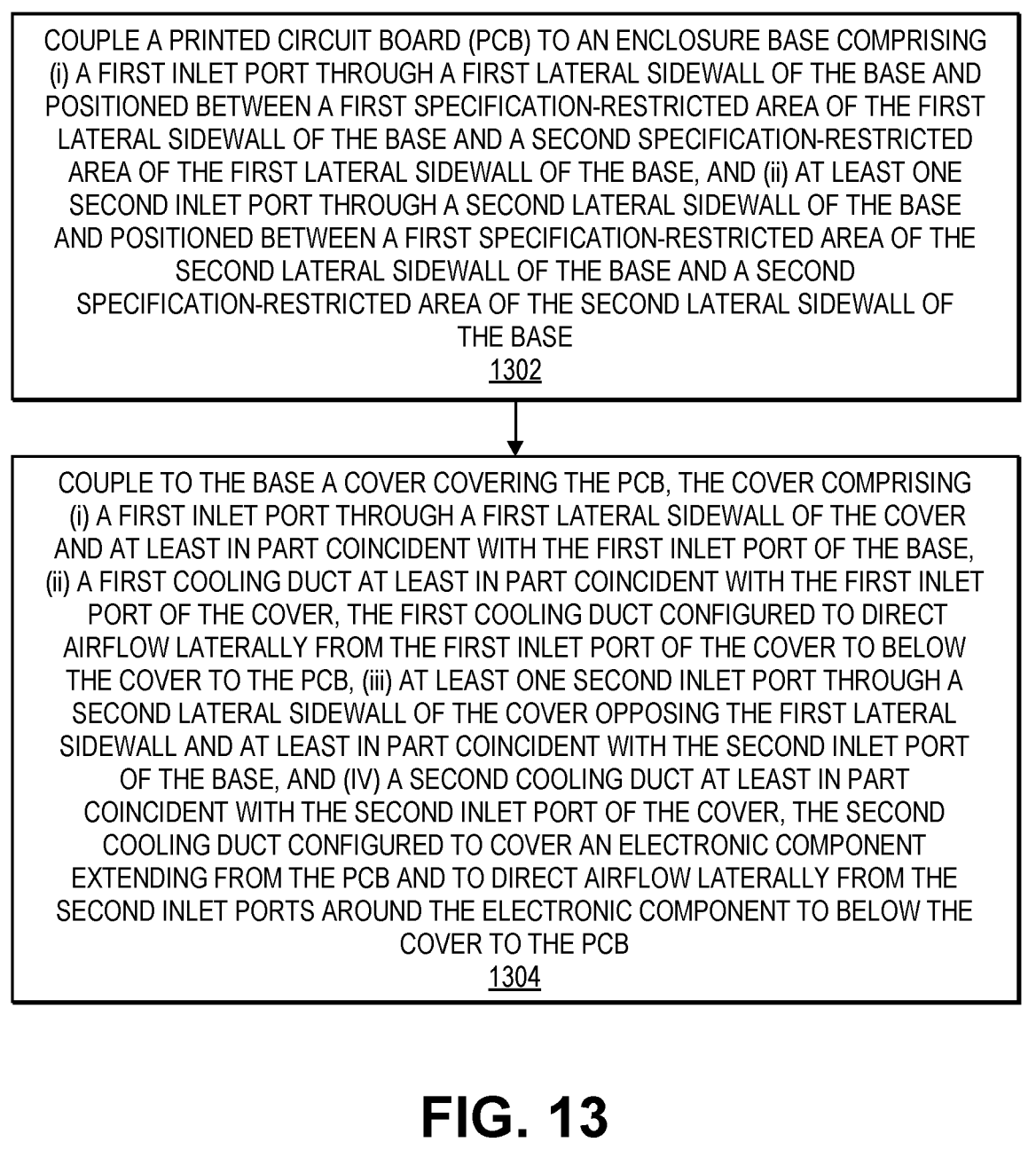

COUPLE A PRINTED CIRCUIT BOARD (PCB) TO AN ENCLOSURE BASE COMPRISING (i) A FIRST INLET PORT THROUGH A FIRST LATERAL SIDEWALL OF THE BASE AND POSITIONED BETWEEN A FIRST SPECIFICATION-RESTRICTED AREA OF THE FIRST LATERAL SIDEWALL OF THE BASE AND A SECOND SPECIFICATION-RESTRICTED AREA OF THE FIRST LATERAL SIDEWALL OF THE BASE, AND (ii) AT LEAST ONE SECOND INLET PORT THROUGH A SECOND LATERAL SIDEWALL OF THE BASE AND POSITIONED BETWEEN A FIRST SPECIFICATION-RESTRICTED AREA OF THE SECOND LATERAL SIDEWALL OF THE BASE AND A SECOND SPECIFICATION-RESTRICTED AREA OF THE SECOND LATERAL SIDEWALL OF THE BASE
1302

COUPLE TO THE BASE A COVER COVERING THE PCB, THE COVER COMPRISING (i) A FIRST INLET PORT THROUGH A FIRST LATERAL SIDEWALL OF THE COVER AND AT LEAST IN PART COINCIDENT WITH THE FIRST INLET PORT OF THE BASE, (ii) A FIRST COOLING DUCT AT LEAST IN PART COINCIDENT WITH THE FIRST INLET PORT OF THE COVER, THE FIRST COOLING DUCT CONFIGURED TO DIRECT AIRFLOW LATERALLY FROM THE FIRST INLET PORT OF THE COVER TO BELOW THE COVER TO THE PCB, (iii) AT LEAST ONE SECOND INLET PORT THROUGH A SECOND LATERAL SIDEWALL OF THE COVER OPPOSING THE FIRST LATERAL SIDEWALL AND AT LEAST IN PART COINCIDENT WITH THE SECOND INLET PORT OF THE BASE, AND (IV) A SECOND COOLING DUCT AT LEAST IN PART COINCIDENT WITH THE SECOND INLET PORT OF THE COVER, THE SECOND COOLING DUCT CONFIGURED TO COVER AN ELECTRONIC COMPONENT EXTENDING FROM THE PCB AND TO DIRECT AIRFLOW LATERALLY FROM THE SECOND INLET PORTS AROUND THE ELECTRONIC COMPONENT TO BELOW THE COVER TO THE PCB
1304

FIG. 13

STORAGE DEVICE COOLING AIR VENTILATION FEATURES

FIELD OF EMBODIMENTS

Embodiments of the invention may relate generally to electronic devices such as solid-state storage devices, and particularly to cooling air ventilation features.

BACKGROUND

Enterprise solid-state storage devices, or solid-state drives (SSDs), are commonly used in client, hyperscale and enterprise compute environments. Since SSDs are made from flash memory (e.g., NAND (NOT AND) flash memory), they can be built in many different form factors and are typically associated with industry standard form factors and corresponding specifications and protocols. For example, a family of specifications referred to as Enterprise and Datacenter Standard Form Factor (EDSFF) were developed to address the concerns of data center storage. For example, EDSFF E3 is a family of form factors designed to update and replace the traditional U.2 2.5-inch form factor in servers and storage systems, and were largely designed for future servers and storage systems. The primary usage of E3 is for SSDs and/or storage class memory, but E3 is big enough to accommodate a broader range of device types (for non-limiting examples, accelerators or network interface cards). It is well-known that electronic devices generally and SSDs in particular dissipate power in the form of heat, which requires significant cooling and related costs.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which:

FIG. 13 is a flow diagram illustrating a method of assembling a data storage device, according to an embodiment.

DETAILED DESCRIPTION

Figure 1:
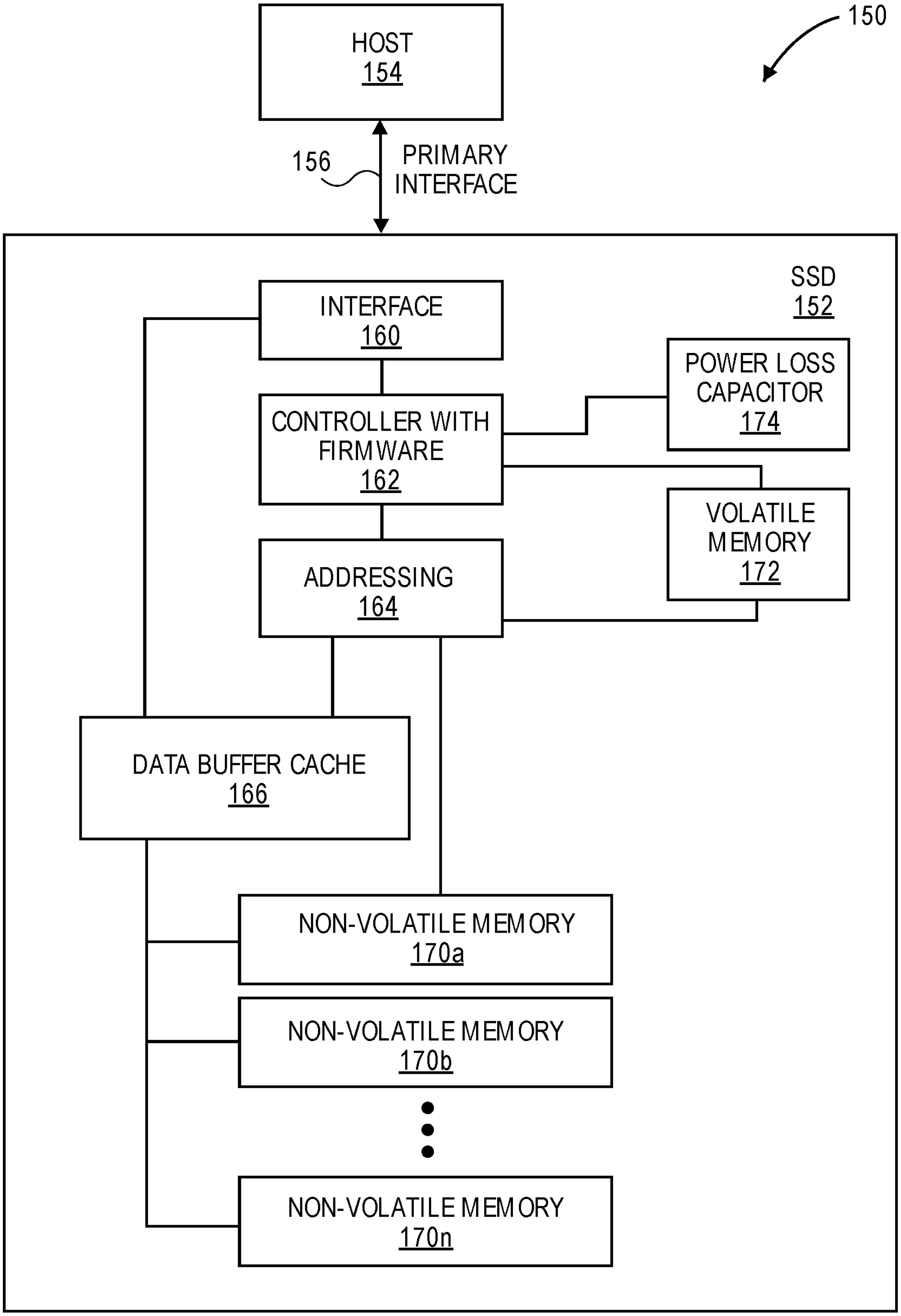
FIG. 1 is a block diagram illustrating a solid-state drive (SSD), according to an embodiment.

Generally, approaches to electronic device cooling air ventilation features, such as for solid-state drives, are described. In the following description, for the purposes of explanation, numerous specific details are set forth to provide a thorough understanding of the embodiments of the invention described herein. It will be apparent, however, that the embodiments of the invention described herein may be practiced without these specific details. In other instances, well-known structures and devices may be shown in block diagram form to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that enterprise storage solutions such as solid-state drives (SSDs) are commonly used in client, hyperscale and enterprise compute environments, and that a family of specifications referred to as Enterprise and Datacenter Standard Form Factor (EDSFF) were developed to address the concerns of data center storage. Furthermore, the specifications for the EDSFF E3 (or simply "E3") family of form factors set forth constraints related to various structures corresponding to an E3 storage device, such as what portions of a device sidewall must be reserved for grounding surfaces and riding surfaces (e.g., related to device handling/installation). In view of the cooling needs of an SSD, and further in view of the limited structural space available for cooling features on an SSD, efficiently and inexpensively cooling an SSD remains a challenge, especially in the context of high-velocity airflow such as in high-performance datacenter and server systems.

Electronic Storage Device Cooling Features

Figure 2A:
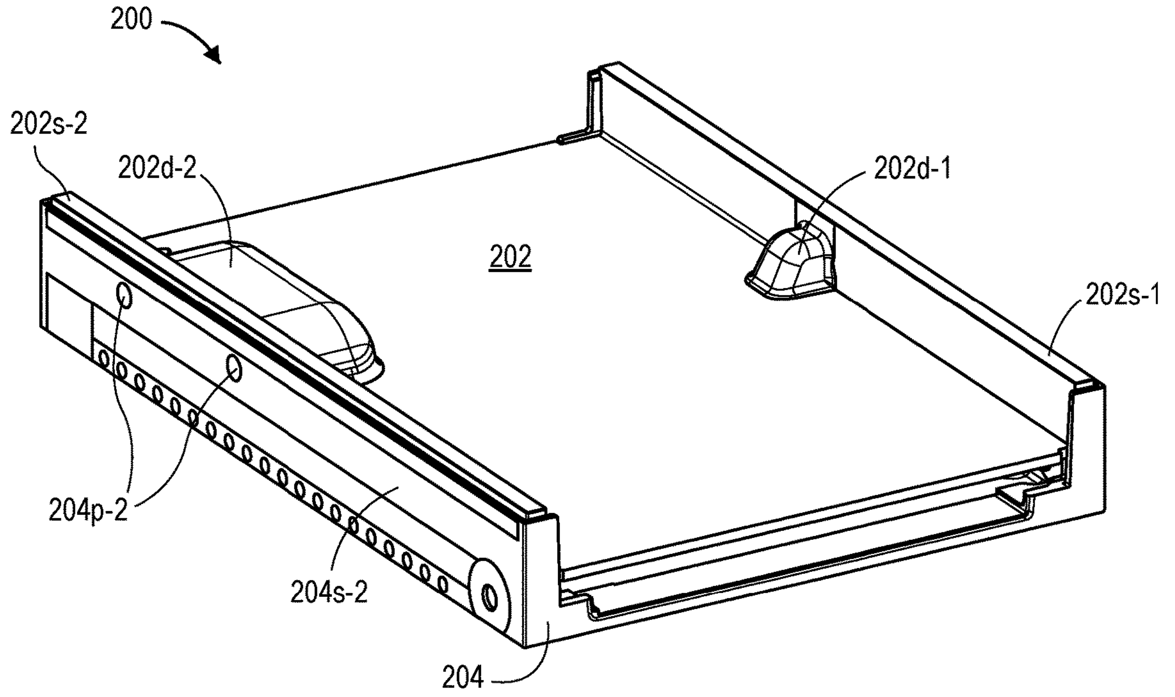
FIG. 2A is a perspective view illustrating SSD device cooling duct features, according to an embodiment.
Figure 2B:
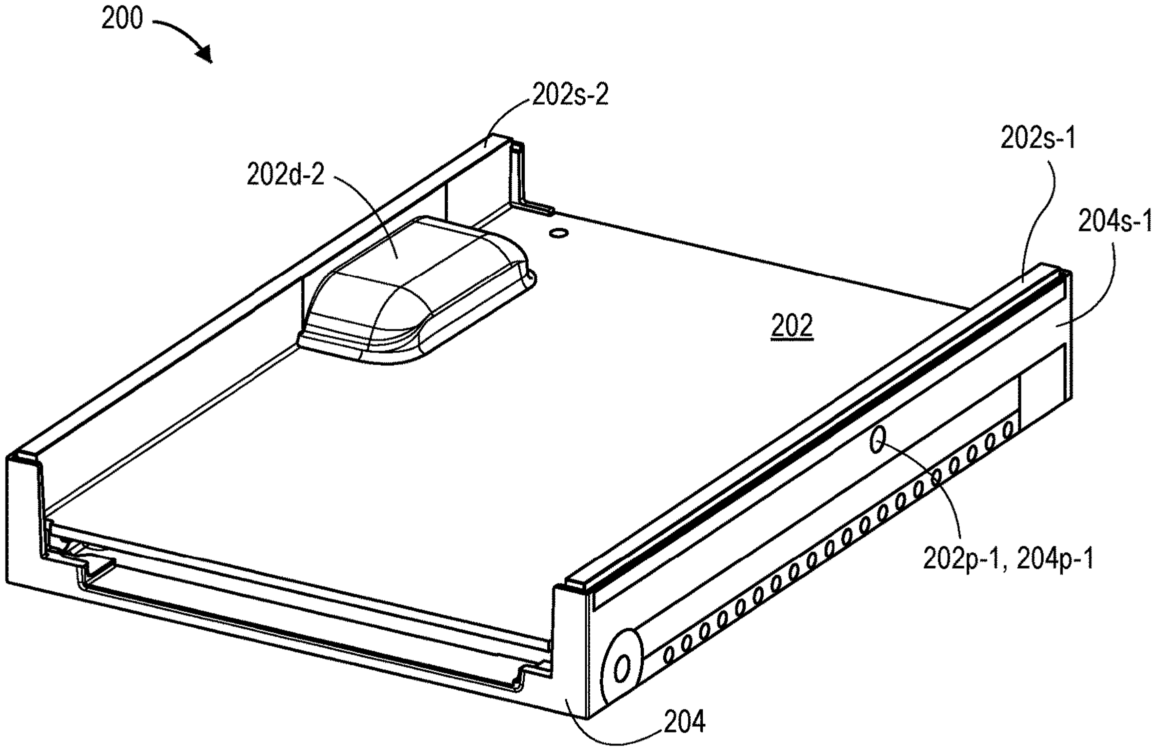
FIG. 2B is a perspective view illustrating SSD device cooling duct features, according to an embodiment.

FIG. 2A is a perspective view illustrating SSD device cooling duct features, and FIG. 2B is a perspective view illustrating SSD device cooling duct features, both according to embodiments. An electronic storage device such as illustrated storage device 200 is configured to comprise one or more printed circuit board (PCB) (PCB 210 of FIGS. 5B-5E; see also, e.g., the components of SSD 152 of FIG. 1) within a device enclosure described hereafter. According to an embodiment, storage device 200 comprises a PCB including non-volatile memory. Similarly, and according to an embodiment, storage device 200 comprises a PCB including NAND (NOT AND) flash memory. Furthermore, and according to an embodiment, storage device 200 is a solid-state drive (SSD) storage device (see, e.g., SSD 152 of FIG. 1).

Storage device 200 comprises an enclosure cover 202 ("cover 202") coupled to an enclosure base 204 ("base 204"). According to an embodiment, cover 202 comprises a first inlet port 202*p*-1 through a first lateral sidewall 202*s*-1 and a first cooling duct 202*d*-1 at least in part coincident with the first inlet port 202*p*-1, where the first cooling duct 202*d*-1 is configured to direct and guide airflow laterally (e.g., side-to-side) from the first inlet port 202*p*-1 to below the cover 202 to the PCB 210 (see, e.g., FIG. 3D). According to an embodiment, cover 202 further comprises at least one second inlet port 202*p*-2 through a second lateral sidewall 202*s*-2 opposing the first lateral sidewall, and a second cooling duct 202*d*-2 at least in part coincident with the second inlet port 202*p*-2. The second cooling duct 202*d*-2 is configured to cover an electronic component 210-1 (FIG. 5C) extending from the PCB 210 and to direct and guide airflow laterally from the second inlet port 202*p*-2 around the electronic component 210-1 to below the cover 202 to the PCB 210 (see, e.g., FIG. 3C).

Figure 3A:
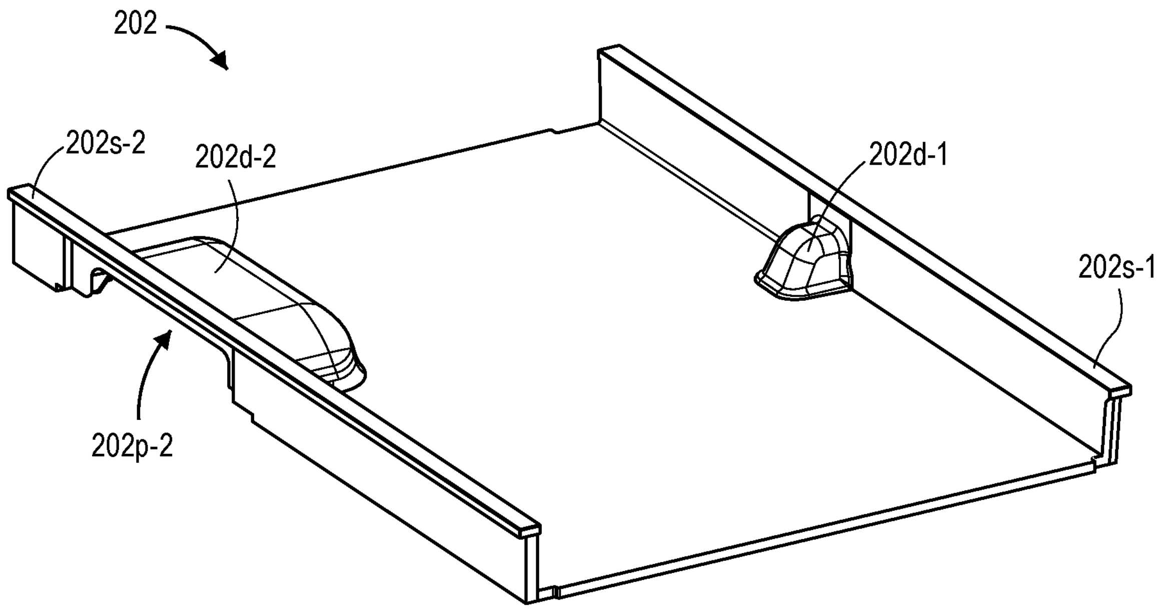
FIG. 3A is a top perspective view illustrating a top cover of SSD device of FIGS. 2A-2B, according to an embodiment.
Figure 3B:
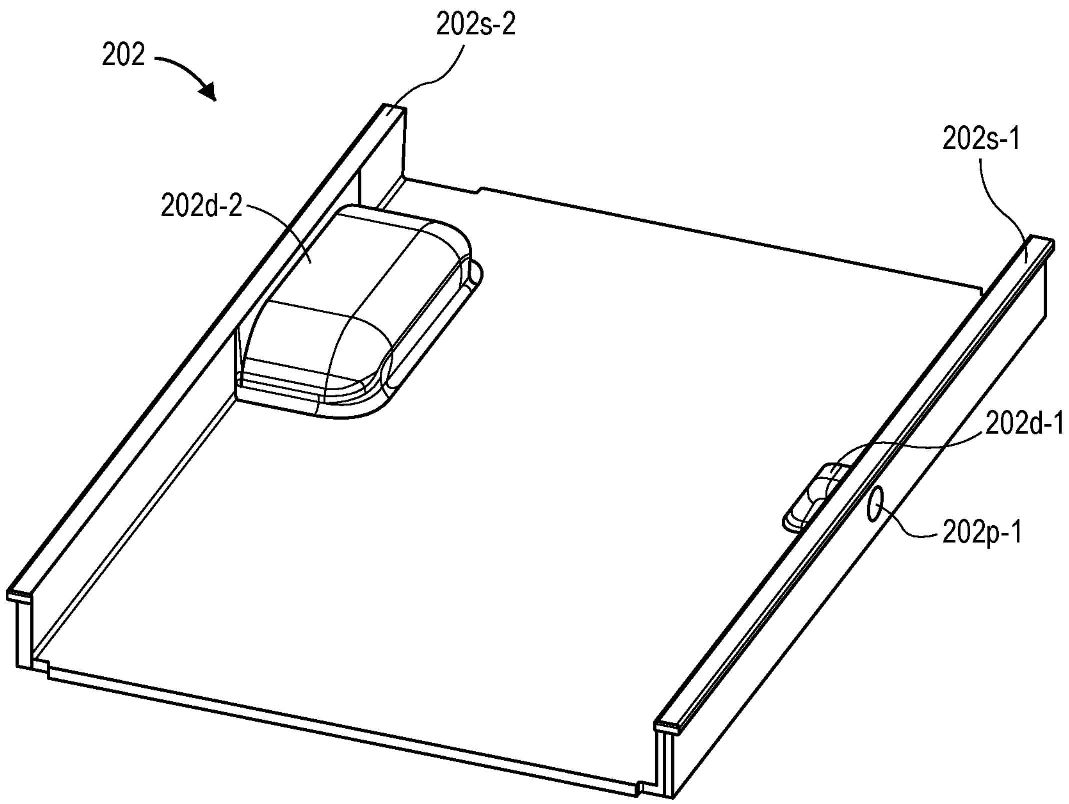
FIG. 3B is a top perspective view illustrating a top cover of SSD device of FIGS. 2A-2B, according to an embodiment.
Figure 3C:
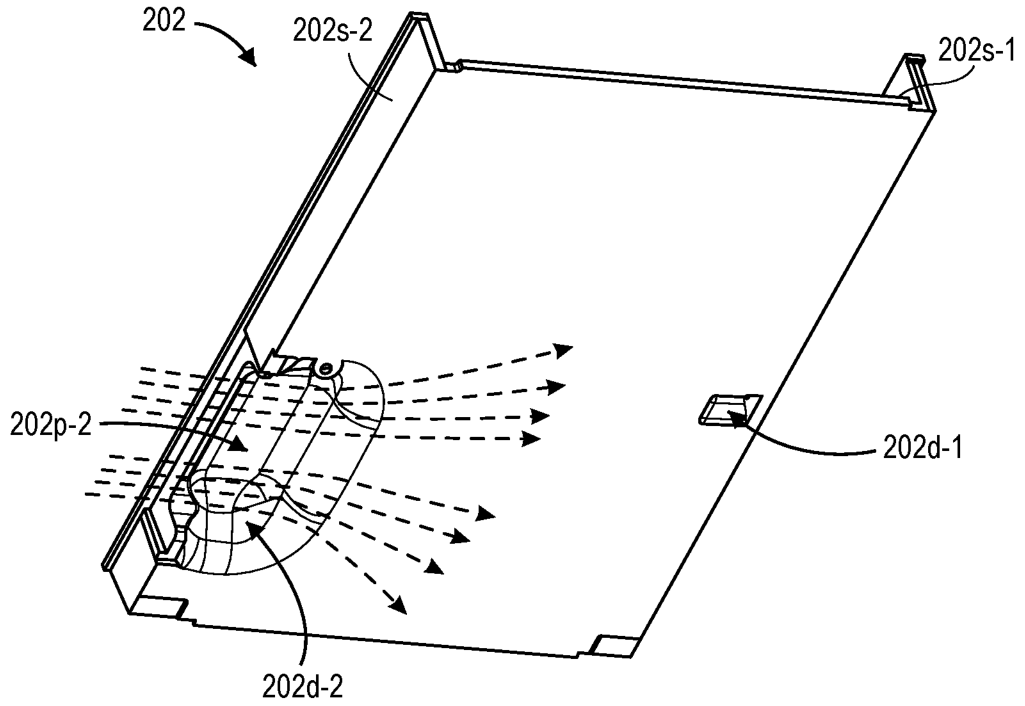
FIG. 3C is a bottom perspective view illustrating a top cover of SSD device of FIGS. 2A-2B, according to an embodiment.
Figure 3D:
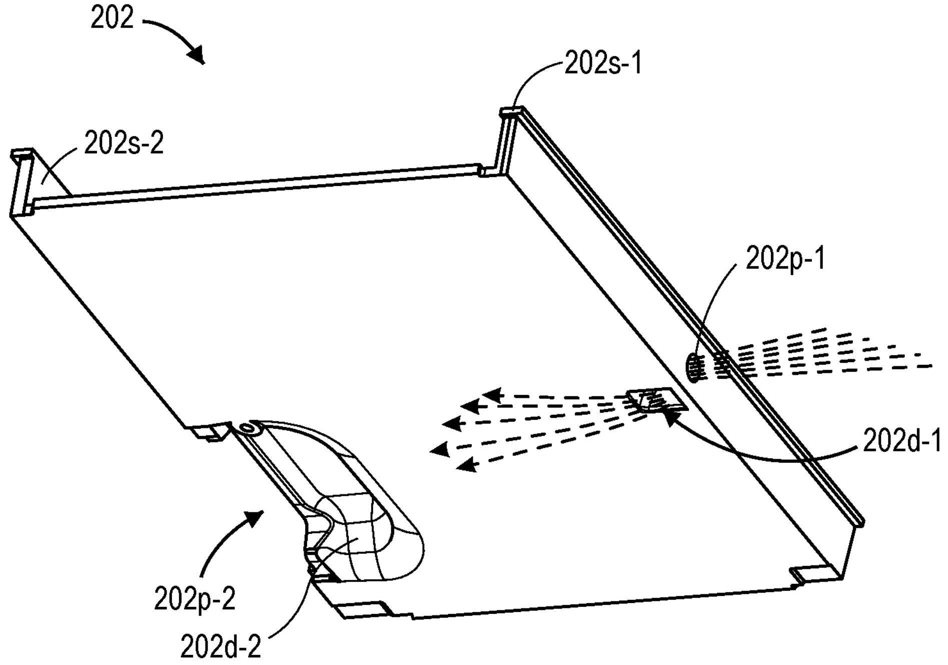
FIG. 3D is a bottom perspective view illustrating a top cover of SSD device of FIGS. 2A-2B, according to an embodiment.

FIG. 3A is a top perspective view illustrating a top cover of SSD device of FIGS. 2A-2B, FIG. 3B is a top perspective view illustrating a top cover of SSD device of FIGS. 2A-2B, FIG. 3C is a bottom perspective view illustrating a top cover of SSD device of FIGS. 2A-2B, and FIG. 3D is a bottom perspective view illustrating a top cover of SSD device of FIGS. 2A-2B, all according to embodiments. Illustrated further here are the first inlet port 202*p*-1 (see, e.g., FIG. 3B) through the first lateral sidewall 202*s*-1 and the coincident first cooling duct 202*d*-1 (see, e.g., FIG. 3A) of cover 202. As discussed, the first cooling duct 202*d*-1 is configured to direct airflow laterally from the first inlet port 202*p*-1 to below the cover 202 to the PCB 210 (see, e.g., FIG. 3D), whereby the placement of the first cooling duct 202*d*-1 and first inlet port 202*p*-1 may vary from implementation to implementation based, for example, on PCB hot spot target(s) (for non-limiting examples, controller, NAND, and the like). Cooling duct 202*d*-1, 202*d*-2 count, opening size, and placement may vary from implementation to implementation based, for non-limiting examples, on cooling performance goals and in view structural properties (e.g., shock, vibration, thermal cycle, etc.) and electromagnetic compatibility ("EMC") performance and the like. Furthermore, according to embodiments the airflow direction may be adjusted by complementary design and placement of PCB 210 components, as well as by complementary placement of thermal interface material ("TIM", e.g., which conducts heat between two or more mating surfaces) according to a detail design.

As discussed and according to an embodiment, the second cooling duct 202*d*-2 of the cover 202 is configured to cover an electronic component 210-1 (FIG. 5C) extending from the PCB 210 and to direct airflow laterally from the second inlet port 202*p*-2 around the electronic component 210-1 to below the cover 202 to the PCB 210 (see, e.g., FIG. 3C). For example, PCB 210 of storage device 200 may include an electronic capacitor (see, e.g., power loss capacitor 174 of FIG. 1) that may be a relatively large electronic component that therefore extends from the main board of PCB 210. Here, cooling duct 202*d*-2 may be placed wherever a relatively oversized extending PCB component may be positioned, and may be structurally and/or aerodynamically configured to guide airflow around such a component accordingly.

Figure 4A:
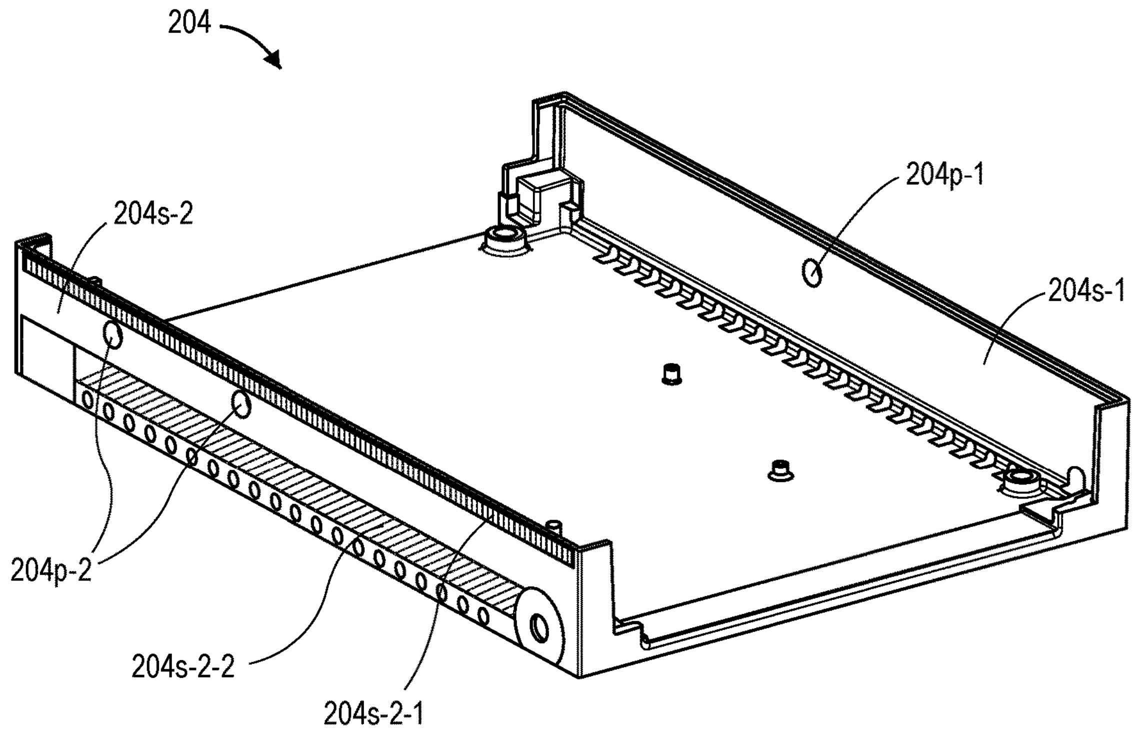
FIG. 4A is a perspective view illustrating a bottom base of SSD device of FIGS. 2A-2B, according to an embodiment.
Figure 4B:
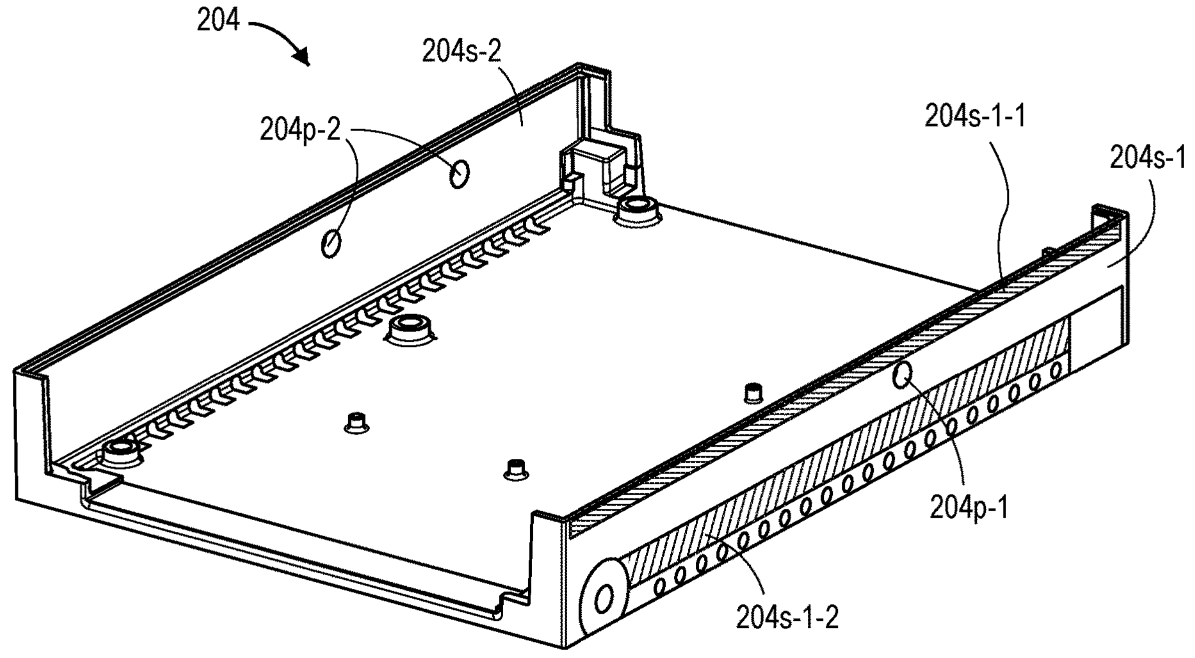
FIG. 4B is a perspective view illustrating a bottom base of SSD device of FIGS. 2A-2B, according to an embodiment.

FIG. 4A is a perspective view illustrating a bottom base of SSD device of FIGS. 2A-2B, and FIG. 4B is a perspective view illustrating a bottom base of SSD device of FIGS. 2A-2B, both according to embodiments. Shown here is the base 204 comprising a first inlet port 204*p*-1 through a first lateral sidewall 204*s*-1 of the base 204 and which is positioned to be substantially coincident with the first inlet port of the cover 202*p*-1. According to an embodiment, the base 204 further comprises at least one second inlet port 204*p*-2 through a second lateral sidewall 204*s*-2 of the base 204 and which is positioned to be substantially coincident with the second inlet port 202*p*-1 of the cover 202. According to an embodiment, one or more inlet port 204*p*-1, 204*p*-2 of base 204 may be augmented with a chamfer feature at the hole edge to increase air velocity.

FIG. 4A further illustrates a first specification-restricted area 204*s*-2-1 of the second lateral sidewall 204*s*-2 of the base 204 and a second specification-restricted area 204*s*-2-2 of the second lateral sidewall 204*s*-2 of the base 204, according to which the at least one second inlet port 204*p*-2 of the base 204 is positioned between to avoid such restricted areas. Similarly, FIG. 4B further illustrates a first specification-restricted area 204*s*-1-1 of the first lateral sidewall 204*s*-1 of the base 204 and a second specification-restricted area 204*s*-1-2 of the first lateral sidewall 204*s*-1 of the base 204, according to which the first inlet port 204*p*-1 of the base 204 is positioned between to avoid those restricted areas. For example, the E3.S 2T (short) and E3.L 2T (long) (both having 16.8 millimeter max thickness form factor) specifications specify that each of the first specification-restricted areas 204*s*-1-1, 204*s*-2-1 of their respective sidewall 204*s*-1, 204*s*-2 are reserved as electrical grounding surface areas. Similarly, the E3.S 2T and E3.L 2T specifications specify that each of the second specification-restricted areas 204*s*-1-2, 204*s*-2-2 of their respective sidewall 204*s*-1, 204*s*-2 are reserved as riding surface areas for positioning of device carriers/installation structures associated with a given storage device 200.

Figure 5A:
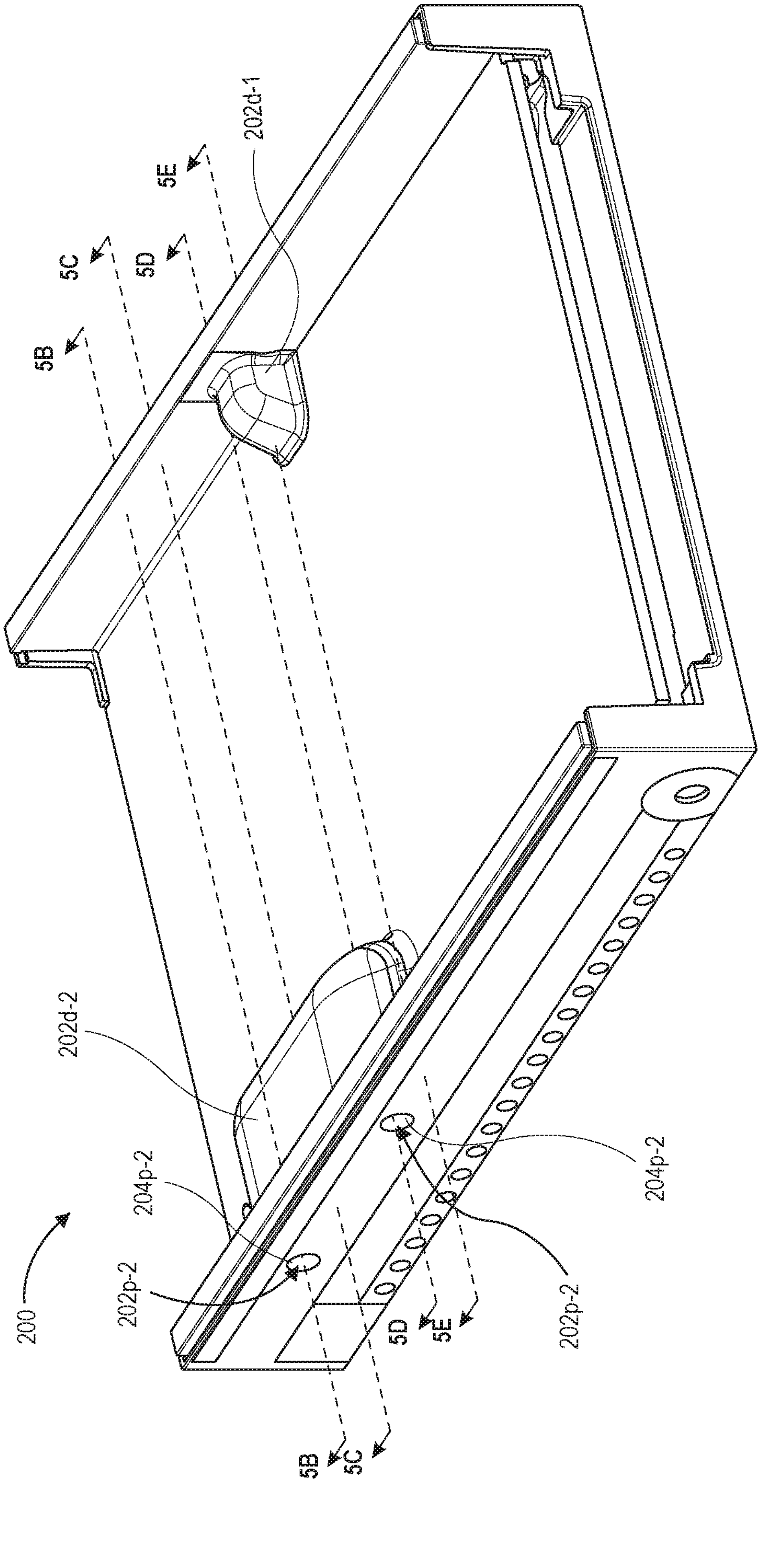
FIG. 5A is a perspective view illustrating an SSD device assembly defining cross-sections, according to an embodiment.
Figure 5B:
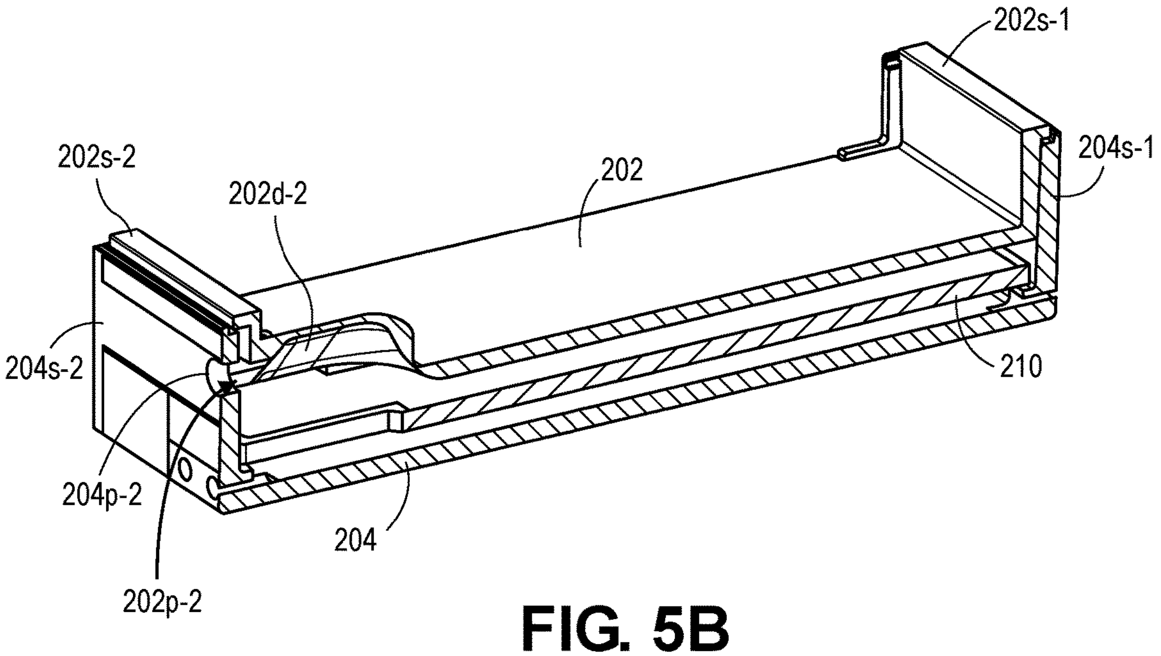
FIG. 5B is a first cross-sectional perspective view illustrating the SSD device assembly of FIG. 5A, according to an embodiment.
Figure 5C:
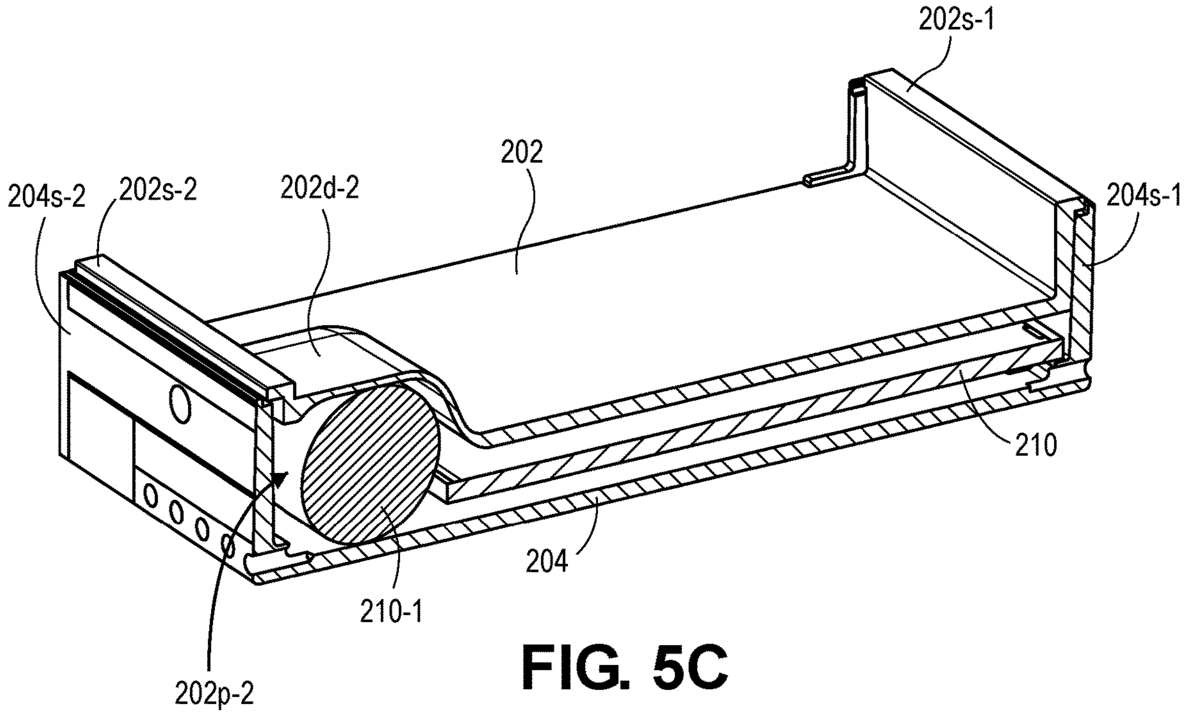
FIG. 5C is a second cross-sectional perspective view illustrating the SSD device assembly of FIG. 5A, according to an embodiment.
Figure 5D:
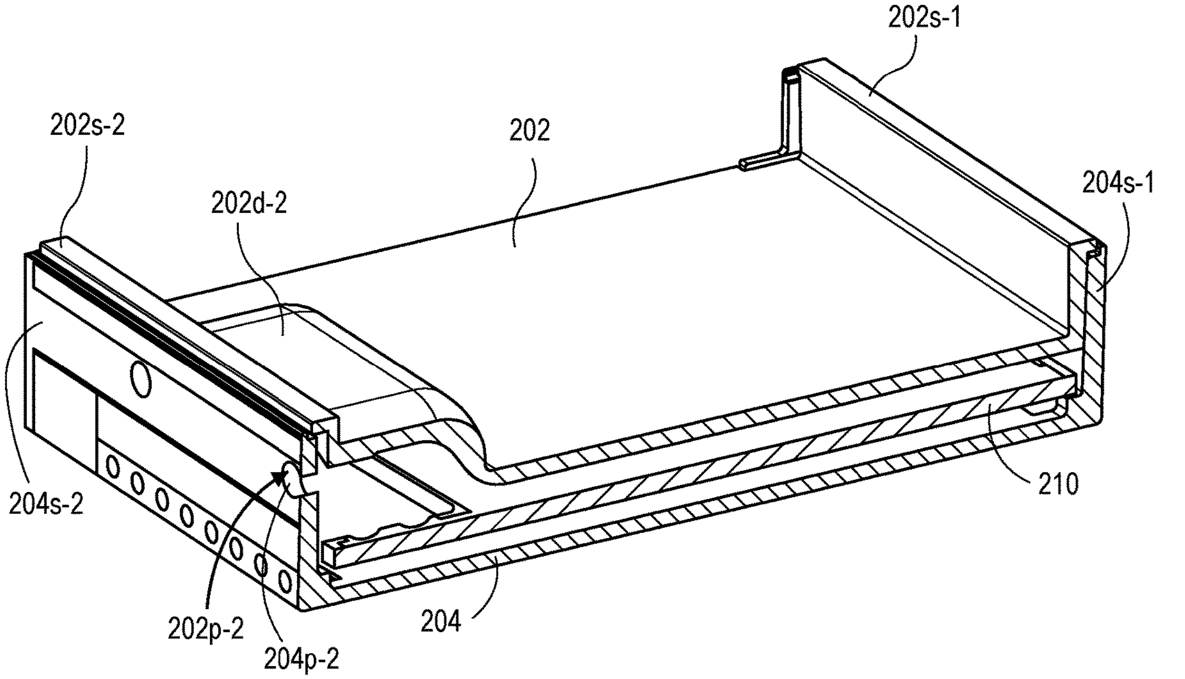
FIG. 5D is a third cross-sectional perspective view illustrating the SSD device assembly of FIG. 5A, according to an embodiment.
Figure 5E:
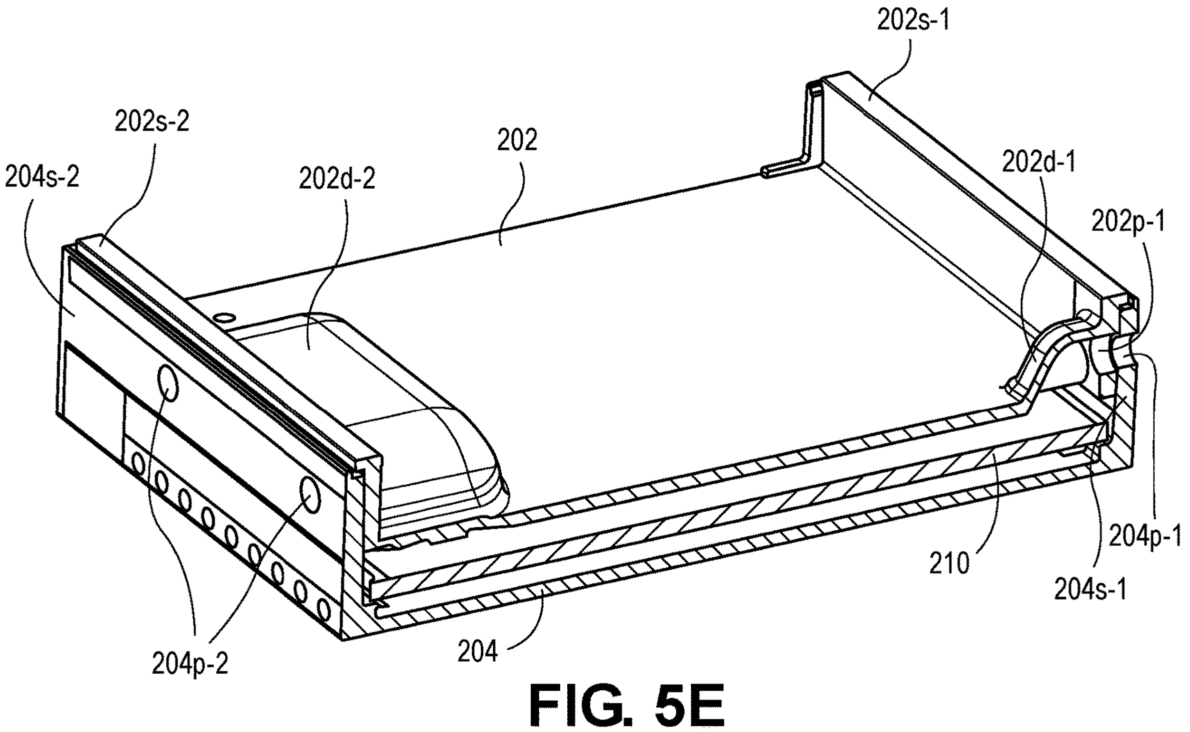
FIG. 5E is a fourth cross-sectional perspective view illustrating the SSD device assembly of FIG. 5A, according to an embodiment.

FIG. 5A is a perspective view illustrating an SSD device assembly defining cross-sections, FIG. 5B is a first cross-sectional perspective view illustrating the SSD device assembly of FIG. 5A, FIG. 5C is a second cross-sectional perspective view illustrating the SSD device assembly of FIG. 5A, FIG. 5D is a third cross-sectional perspective view illustrating the SSD device assembly of FIG. 5A, and FIG. 5E is a fourth cross-sectional perspective view illustrating the SSD device assembly of FIG. 5A, all according to embodiments. Collectively, FIGS. 5A-5E further illustrate the foregoing cooling duct/inlet features.

Thus, FIG. 5B illustrates a first cross-section 5B-5B of storage device 200, sectioning through a second inlet port 204*p*-2 of the base 204, and a second inlet port 202*p*-2 and corresponding second cooling duct 202*d*-2 of the cover 202 of storage device 200, including some of the airflow-directing structural contour (e.g., laterally and longitudinally) of the inside of second cooling duct 202*d*-2. FIG. 5C illustrates a second cross-section 5C-5C of storage device 200, sectioning through the second lateral sidewall 204*s*-2 of the base 204, and the second inlet port 202*p*-2 and corresponding second cooling duct 202*d*-2 of the cover 202, including some of the airflow-directing structural contour of the inside of second cooling duct 202*d*-2 around the electronic component 210-1 of PCB 210. FIG. 5D illustrates a third cross-section 5D-5D of storage device 200, again sectioning through a second inlet port 204*p*-2 of the base 204, and the second inlet port 202*p*-2 and corresponding second cooling duct 202*d*-2 of the cover 202, including some of the airflow-directing structural contour (primarily laterally) of the inside of second cooling duct 202*d*-2, directing airflow to PCB 210 (electronic component 210-1 removed in this view). Finally, FIG. 5E illustrates a fourth cross-section 5E-5E of storage device 200, sectioning through the first inlet port 204*p*-1 of the base 204 and the first inlet port 202*p*-1 and corresponding first cooling duct 202*d*-1 of the cover 202, including some of the airflow-directing structural contour of the inside of second cooling duct 202*d*-1, directing airflow to PCB 210.

Figure 6:
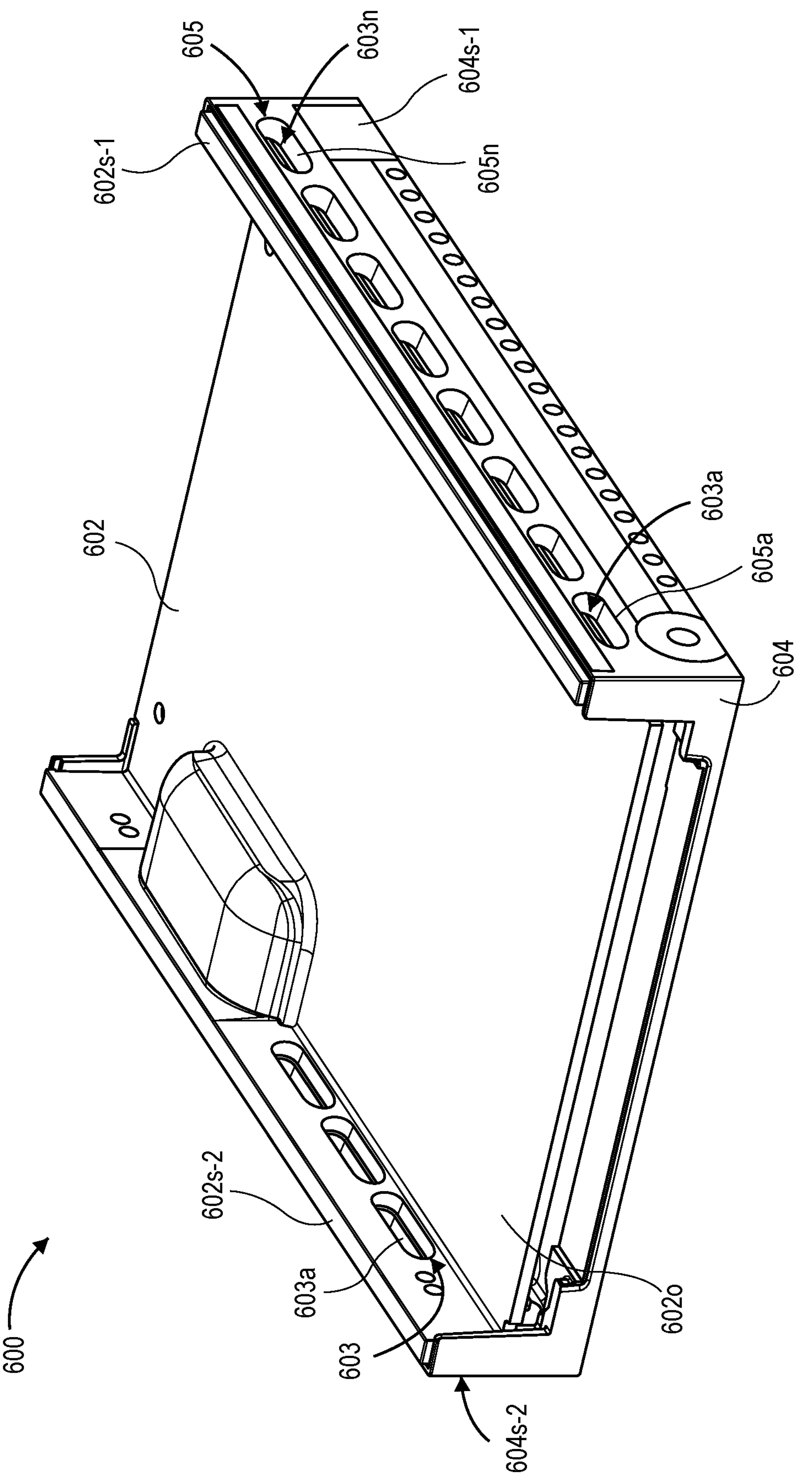
FIG. 6 is a perspective view illustrating an SSD device assembly with cooling ventilation features, according to an embodiment.

FIG. 6 is a perspective view illustrating an SSD device assembly with cooling ventilation features, according to an embodiment. An electronic storage device such as illustrated storage device 600 is configured to comprise one or more printed circuit board such as PCB 210 of FIGS. 5B-5E (see also, e.g., the components of SSD 152 of FIG. 1) within a device enclosure described hereafter. According to an embodiment, storage device 600 comprises a PCB including non-volatile memory. Similarly, and according to an embodiment, storage device 600 comprises a PCB including NAND (NOT AND) flash memory. Furthermore, and according to an embodiment, storage device 600 is a solid-state drive (SSD) storage device (see, e.g., SSD 152 of FIG. 1).

Storage device 600 comprises an enclosure cover 602 ("cover 602") coupled to an enclosure base 604 ("base 604"). According to an embodiment, cover 602 comprises a first row 603 of first ventilation slots 603*a*-603*n*, through a first lateral sidewall 602*s*-1 of the cover 602, configured to direct airflow generally laterally over an outer side 6020 of the cover 602. Likewise, according to an embodiment the cover 602 comprises second row 603 of second ventilation slots 603*a*-603*m*, through a second lateral sidewall 602*s*-2 of the cover 602 (see, e.g., FIGS. 7A-7B). Similarly, the base 604 comprises a first row 605 of first ventilation slots 605*a*-605*n*, through a first lateral sidewall 604*s*-1 of the base 604 and substantially coincident with the first ventilation slots 603*a*-603*n* of the cover 602, configured to direct airflow generally laterally over the outer side 6020 of the cover 602. Here also, according to an embodiment the base 604 comprises a second row 605 of second ventilation slots 605*a*-605*m*, through a second lateral sidewall 604*s*-2 of the base 604 (see, e.g., FIGS. 8A-8B), and substantially coincident with the second ventilation slots 603*a*-603*m* of the cover 602. The utilization of such ventilation slots 603*a*-603*n*, 605*a*-605*n* to direct airflow over the cover 602 is discussed in more detail elsewhere herein, such as in reference to FIGS. 12A-12C.

Figure 7B:
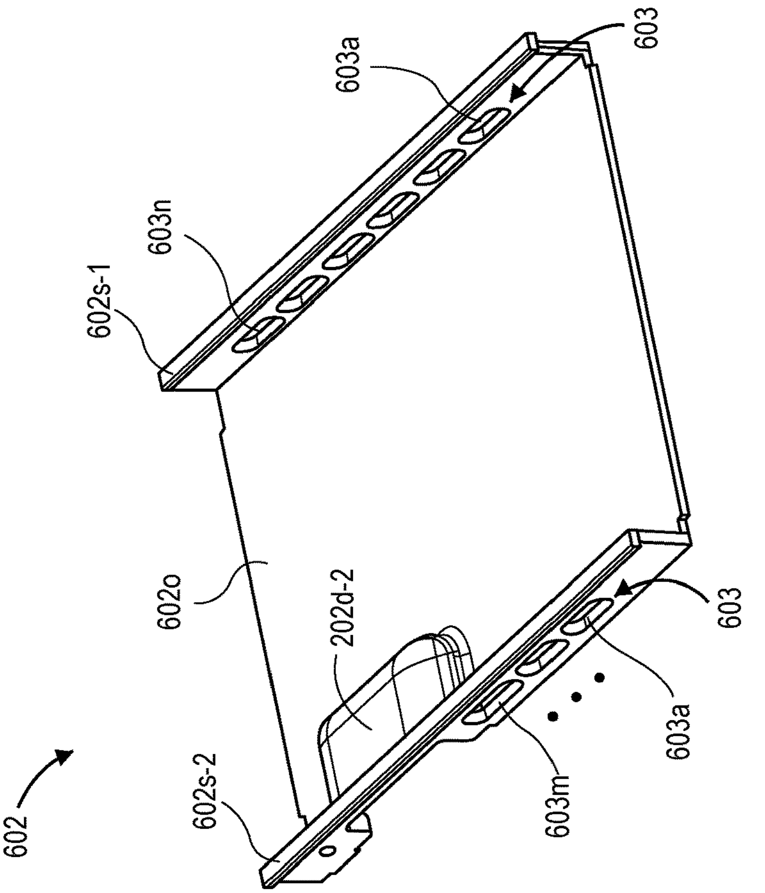
FIG. 7B is a perspective view illustrating the top cover of SSD device of FIG. 6, according to an embodiment.
Figure 7A:
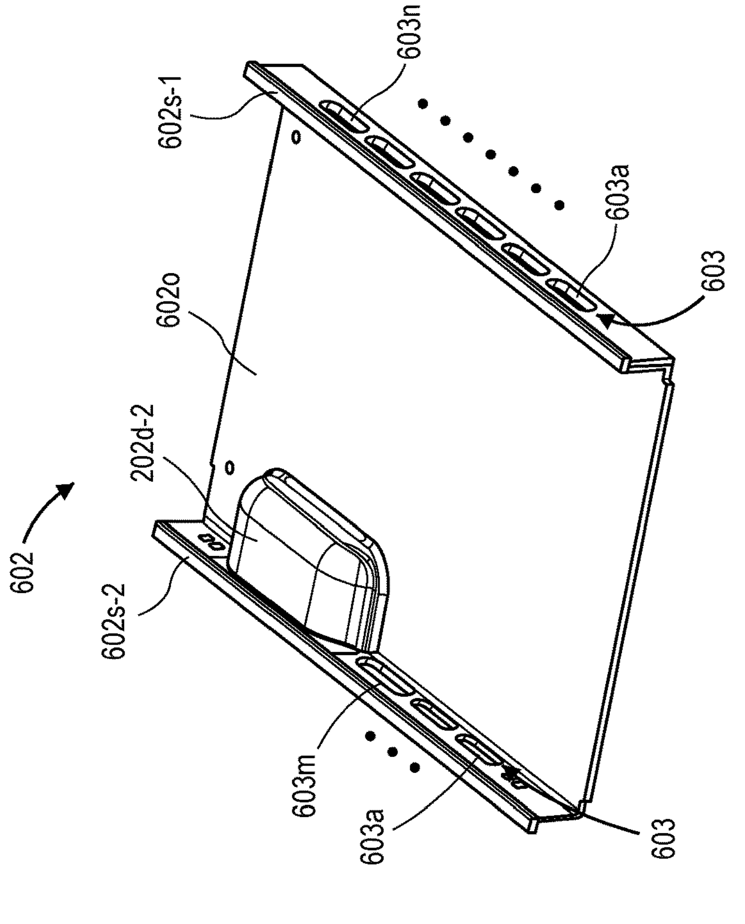
FIG. 7A is a perspective view illustrating a top cover of SSD device of FIG. 6, according to an embodiment.

FIG. 7A is a perspective view illustrating a top cover of SSD device of FIG. 6, and FIG. 7B is a perspective view illustrating the top cover of SSD device of FIG. 6, both according to embodiments. As discussed, cover 602 comprises a row 603 of ventilation slots through one or both of the first and second lateral sidewall 602*s*-1, 602*s*-2, which are configured to direct airflow over the outer side 6020 of the cover 602. In FIGS. 7A-7B, first lateral sidewall 602*s*-1 of cover 602 is depicted with a row 603 of ventilation slots 603*a*-603*n*, where n represents an arbitrary number of slots that may vary from implementation to implementation. Furthermore, second lateral sidewall 602*s*-2 of cover 602 is depicted with a row 603 of ventilation slots 603*a*-603*m*, where m represents an arbitrary number of slots that may vary from implementation to implementation. With implementations in which a second cooling duct is present, such as second cooling duct 202*d*-2 (see, e.g., FIGS. 2A-3D), n and m are likely unequal due to the presence of the second cooling duct 202*d*-2.

Figure 8A:
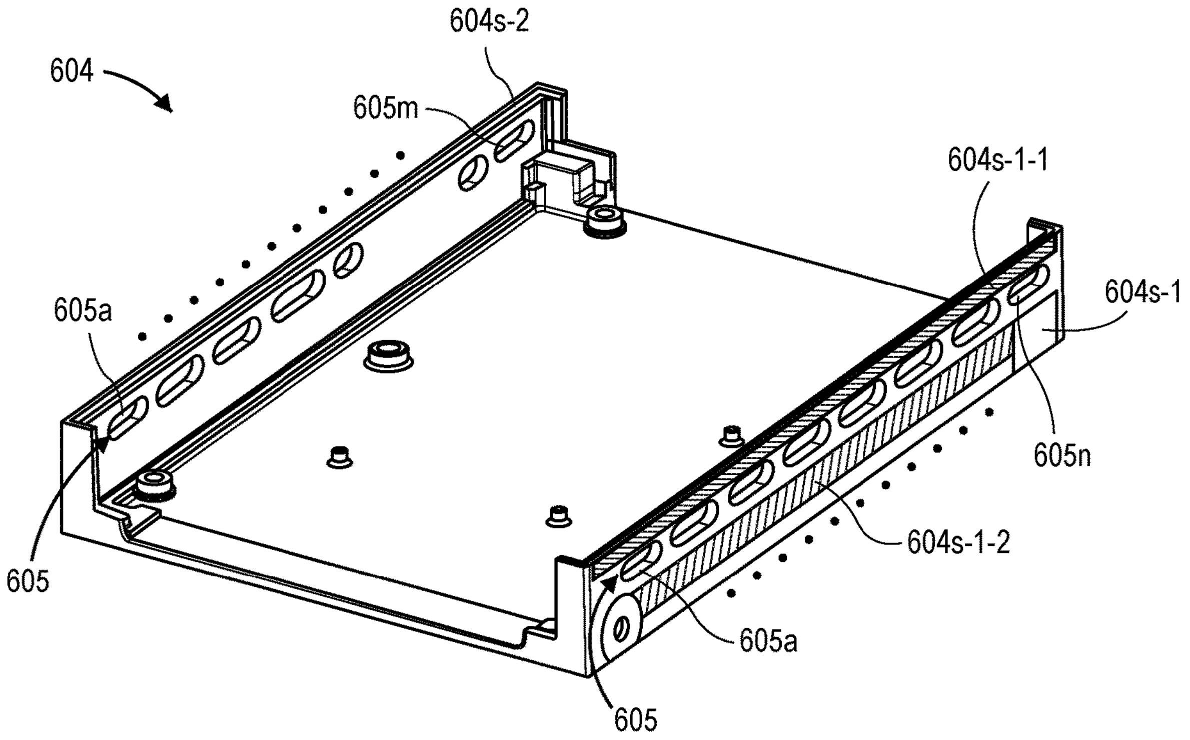
FIG. 8A is a perspective view illustrating a bottom base of SSD device of FIG. 6, according to an embodiment.
Figure 8B:
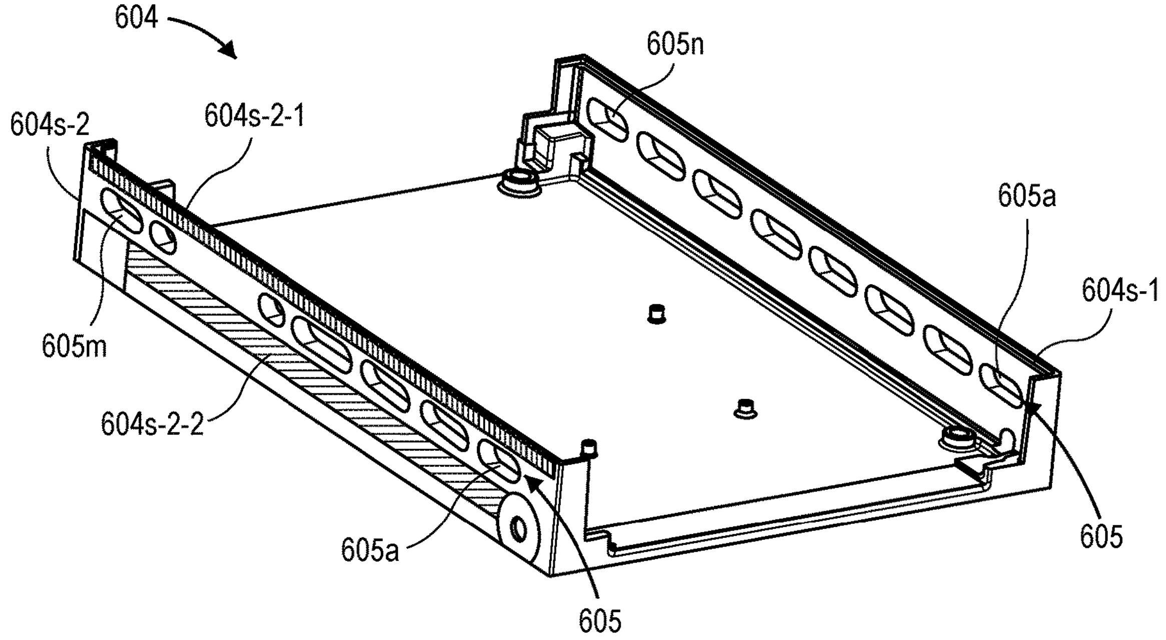
FIG. 8B is a perspective view illustrating the bottom base of SSD device of FIG. 6, according to an embodiment.

FIG. 8A is a perspective view illustrating a bottom base of SSD device of FIG. 6, and FIG. 8B is a perspective view illustrating the bottom base of SSD device of FIG. 6, all according to embodiments. As discussed, base 604 comprises a row 605 of ventilation slots through one or both of the first and second lateral sidewall 604*s*-1, 604*s*-2, which are configured to direct airflow over the outer side 6020 (FIGS. 7A-7B) of the cover 602. In FIGS. 8A-8B, first lateral sidewall 604*s*-1 of base 604 is depicted with a row 605 of ventilation slots 605*a*-605*n*, where n represents an arbitrary number of slots that may vary from implementation to implementation. Furthermore, second lateral sidewall 605*s*-2 of base 604 is depicted with a row 605 of ventilation slots 605*a*-605*m*, where m represents an arbitrary number of slots that may vary from implementation to implementation. As discussed and according to an embodiment, the row 605 of ventilation slots 605*a*-605*n* through the first lateral sidewall 604*s*-1 of the base 604 are positioned between a first specification-restricted area 604*s*-1-1 and a second specification-restricted area 604*s*-1-2 of the of the first lateral sidewall 604*s*-1 of the base 604. Likewise, the row 605 of ventilation slots 605*a*-605*m* through the second lateral sidewall 604*s*-2 of the base 604 are positioned between a first specification-restricted area 604*s*-2-1 and a second specification-restricted area 604*s*-2-2 of the of the second lateral sidewall 604*s*-2 of the base 604.

Figure 9A:
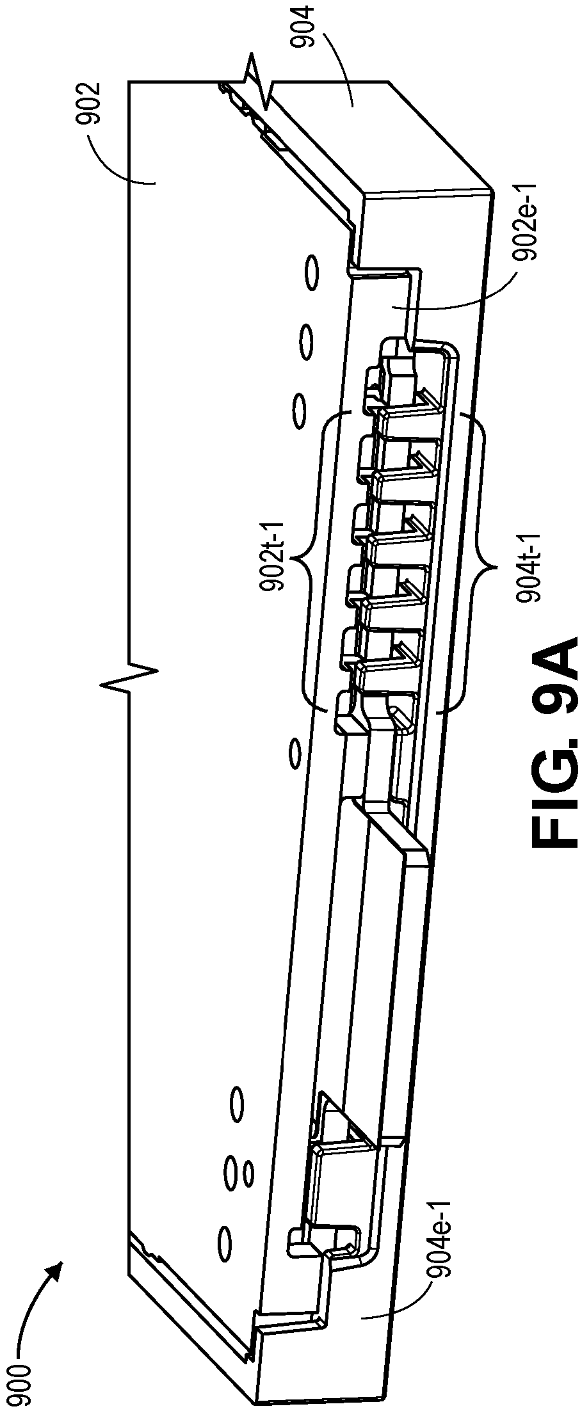
FIG. 9A is a perspective view illustrating a first end of an SSD device assembly with cooling ventilation features, according to an embodiment.
Figure 9B:
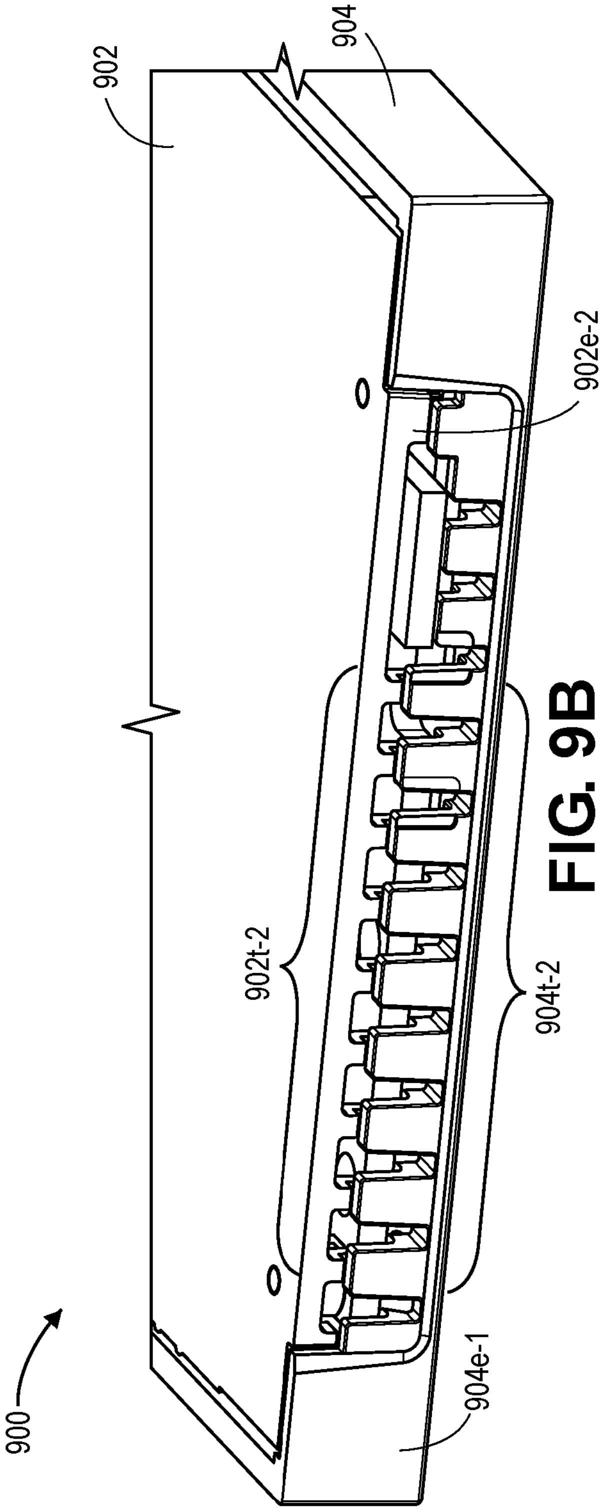
FIG. 9B is a perspective view illustrating a second end of an SSD device assembly with cooling ventilation features, according to an embodiment.

FIG. 9A is a perspective view illustrating a first end of an SSD device assembly with cooling ventilation features, and FIG. 9B is a perspective view illustrating a second end of an SSD device assembly with cooling ventilation features, both according to embodiments. Storage device 900 comprises an enclosure cover 902 ("cover 902") coupled to an enclosure base 904 ("base 904"). According to an embodiment, the cover 902 comprises a first series of tooth structures 902*t*-1 separated by slits 902*s*-1 through a first end wall 902*e*-1 of the cover 902 (e.g., the host connector end), and the base 904 comprises a first series of tooth structures 904*t*-1 separated by slits 904*s*-1 through a first end wall 904*e*-1 of the base 904 (e.g., the host connector end). Each tooth structure of the first series of tooth structures 904*t*-1 of the base 904 mechanically interfaces with a corresponding tooth structure of the first series of tooth structures 902*t*-1 of the cover 902. Furthermore and according to an embodiment, the cover 902 further comprises a second series of tooth structures 902*t*-2 separated by slits 902*s*-2 through a second end wall 902*e*-2 of the cover 902 (e.g., the LED (light-emitting diode) end) opposing the first end wall 902*e*-1 of the cover 902, and the base 904 further comprises a second series of tooth structures 904*t*-2 separated by slits 904*s*-2 through a second end wall 904*e*-2 of the base 904 (e.g., the LED end), opposing the first end wall 904*e*-1 of the base 904. Each tooth structure of the second series of tooth structures 904*t*-2 of the base 904 mechanically interfaces with a corresponding tooth structure of the second series of tooth structures 902*t*-2 of the cover 902.

According to an embodiment, the slits 902*s*-1, 902*s*-2 through the first end wall 902*e*-1 and the second end wall 902*e*-2 of the cover 902 are approximately 2 millimeters wide laterally, and the slits 904*s*-1, 904*s*-2 through the first end wall 904*e*-1 and the second end wall 904*e*-2 of the base 904 are similarly approximately 2 millimeters wide laterally, i.e., sufficiently small enough for mitigating electrostatic discharge (ESD), whereby electrical discharge energy can flow into big openings and shock the electronic components, while still enabling sufficient cooling airflow into and through the storage device 900. ESD, sometimes referred to as "static electricity", is a momentary flow of electrical current between two differently-charged objects when brought into contact or even when brought close together. It is well-known that ESD can cause damage to and even failure of solid-state electronics components such as integrated circuits, which can suffer permanent damage when subjected to high voltages. Thus, sensitive components need to be protected from ESD.

Figure 10A:
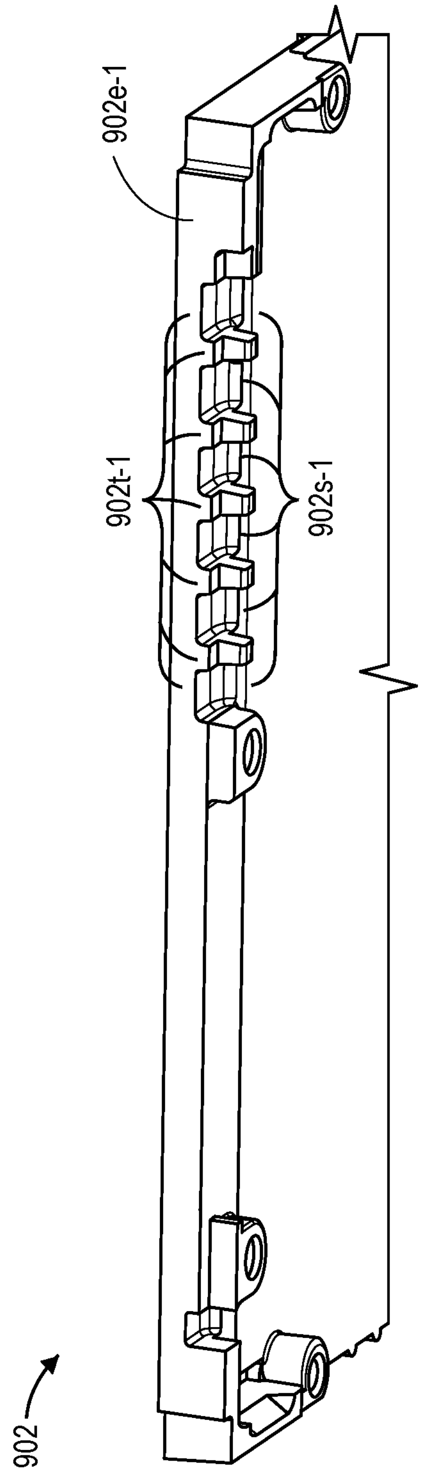
FIG. 10A is a perspective view illustrating the first end of a top cover of SSD device assembly of FIGS. 9A-9B, according to an embodiment.
Figure 10B:
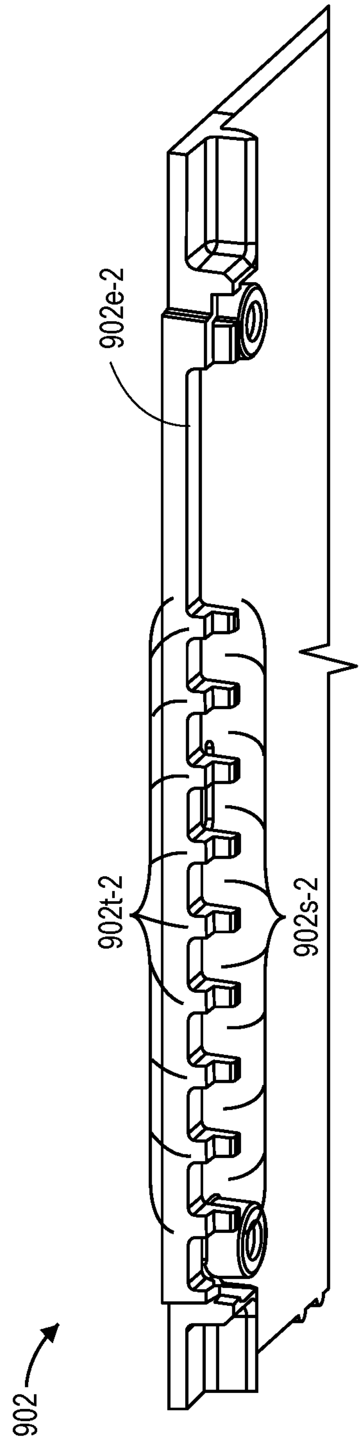
FIG. 10B is a perspective view illustrating the second end of the top cover of SSD device assembly of FIGS. 9A-9B, according to an embodiment.

FIG. 10A is a perspective view illustrating the first end of a top cover of SSD device assembly of FIGS. 9A-9B, and FIG. 10B is a perspective view illustrating the second end of the top cover of SSD device assembly of FIGS. 9A-9B, both according to embodiments. As discussed and as depicted in FIG. 10A, according to an embodiment cover 902 comprises a first series of tooth structures 902*t*-1 separated by slits 902*s*-1, at one first end wall 902*e*-1 of the cover 902. Similarly and as depicted in FIG. 10B, according to an embodiment cover 902 further comprises a second series of tooth structures 902*t*-2 separated by slits 902*s*-2, at one second end wall 902*e*-2 of the cover 902. According to an embodiment, each tooth structure of the first and second series of tooth structures 902*t*-1, 902*t*-2 of the cover 902 comprises a step structure, as depicted in FIGS. 10A-10B, configured for mechanically interfacing with the corresponding tooth structure of the first and second series of tooth structures 904*t*-1, 904*t*-2 (FIGS. 9A-9B, 11A-11B) of the base 904.

Figure 11A:
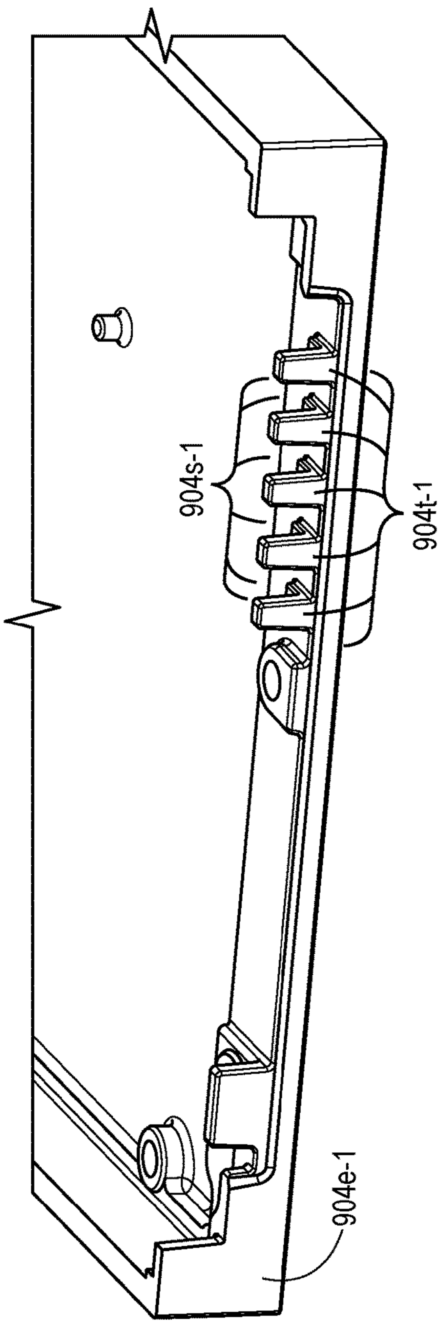
FIG. 11A is a perspective view illustrating the first end of a bottom base of SSD device assembly of FIGS. 9A-9B, according to an embodiment.
Figure 11B:
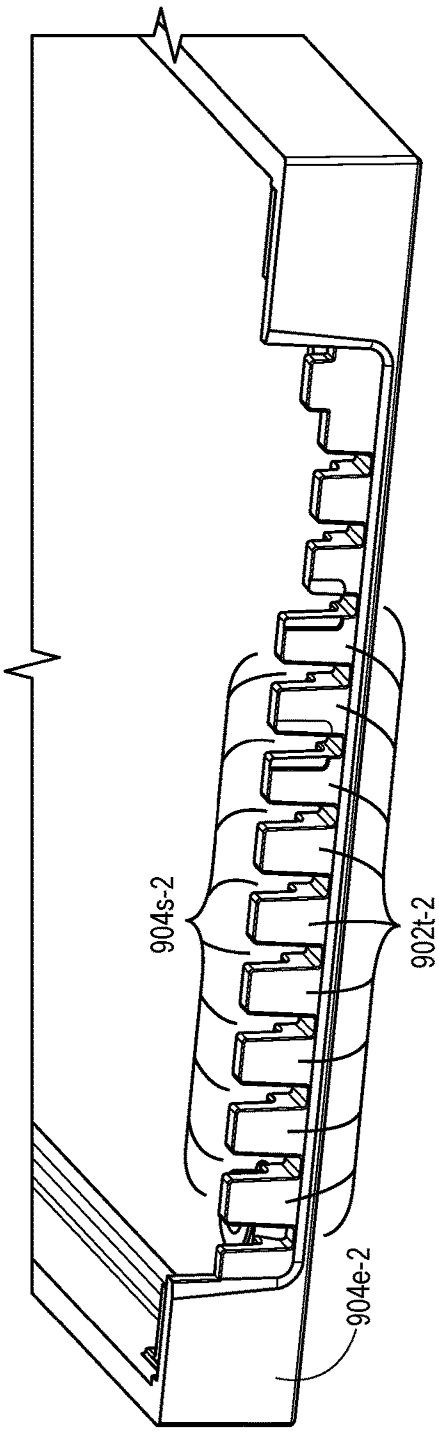
FIG. 11B is a perspective view illustrating the second end of the bottom base of SSD device assembly of FIGS. 9A-9B, according to an embodiment.

FIG. 11A is a perspective view illustrating the first end of a bottom base of SSD device assembly of FIGS. 9A-9B, and FIG. 11B is a perspective view illustrating the second end of the bottom base of SSD device assembly of FIGS. 9A-9B, both according to embodiments. As discussed and as depicted in FIG. 11A, according to an embodiment base 904 comprises a first series of tooth structures 904*t*-1 separated by slits 904*s*-1, at one first end wall 904*e*-1 of the base 904. Similarly and as depicted in FIG. 11B, according to an embodiment base 904 further comprises a second series of tooth structures 904*t*-2 separated by slits 904*s*-2, at one second end wall 904*e*-2 of the base 904. According to an embodiment, each tooth structure of the first and second series of tooth structures 904*t*-1, 904*t*-2 of the base 904 comprises a step structure, as depicted in FIGS. 11A-11B, configured for mechanically interfacing with the corresponding tooth structure of the first and second series of tooth structures 902*t*-1, 902*t*-2 (FIGS. 9A-9B, 10A-10B) of the cover 902.

With known prior approaches to SSDs, small holes are implemented through the enclosure end walls for air ventilation purposes to meet thermal performance requirements. The manufacturing of such small holes required machining (e.g., computer numerical control, or "CNC", machining), requiring a significant material cost increase. By contrast, use of the tooth-slit structures 902*t*-1 with 902*s*-1, 902*t*-2 with 902*s*-2 for the cover 902 and the tooth-slit structures 904*t*-1 with 904*s*-1, 904*t*-2 with 904*s*-2 for the base 904, enables manufacturing of each of the cover 902 and the base 904 by a casting (e.g., diecasting) process absent (or without requiring) machining, e.g., the machining of tiny ventilation holes. Thus, less costly cover 902 and base 904 structures may be manufactured.

Figure 12A:
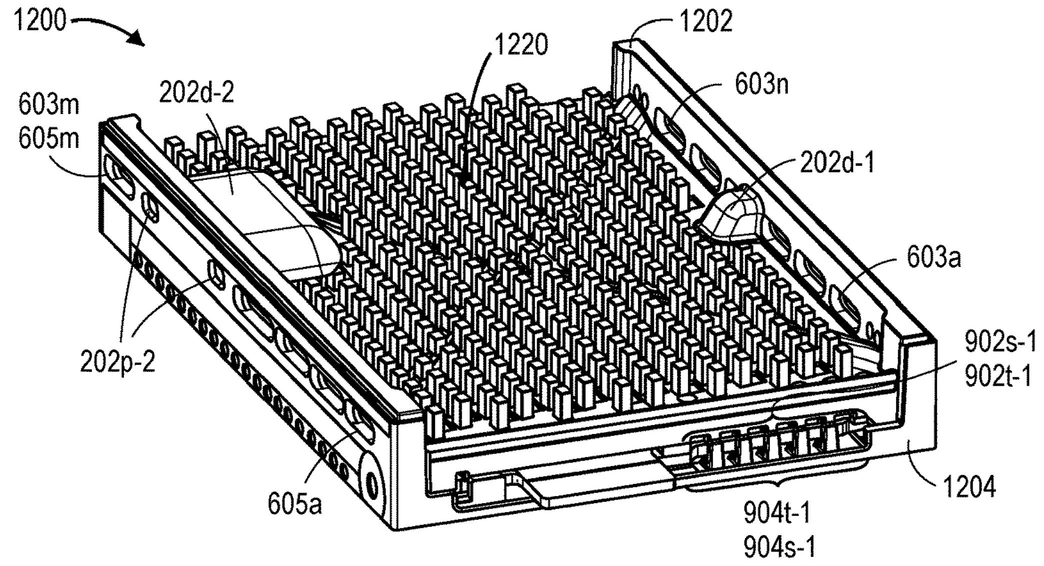
FIG. 12A is an end perspective view illustrating a solid-state storage device, according to an embodiment.
Figure 12B:
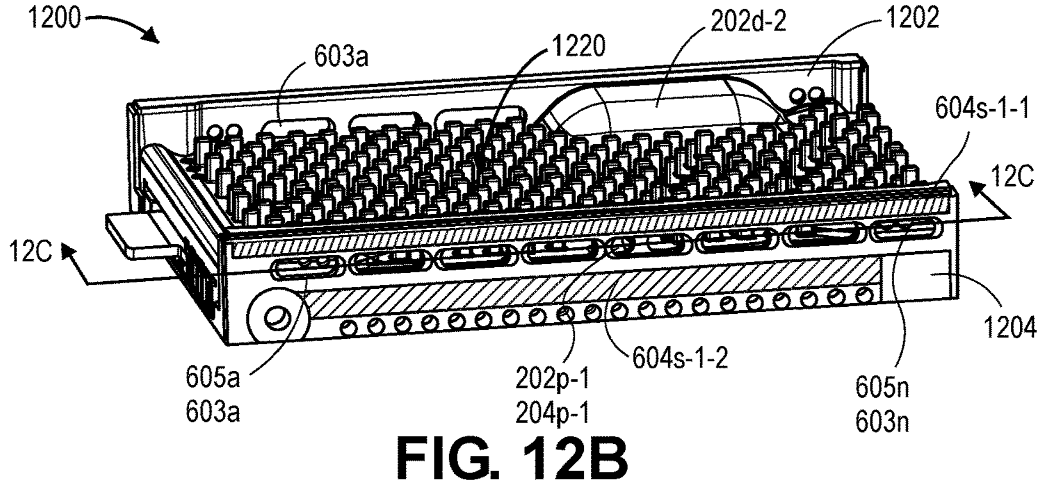
FIG. 12B is a side perspective view illustrating the solid-state storage device of FIG. 12A, according to an embodiment.
Figure 12C:
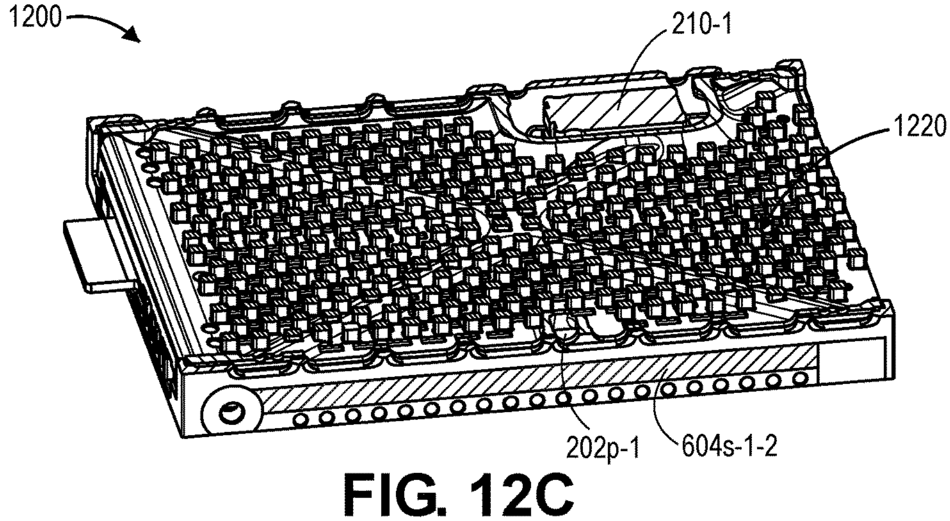
FIG. 12C is a cross-sectional perspective view illustrating the solid-state storage device of FIG. 12A, according to an embodiment.

FIG. 12A is an end perspective view illustrating a solid-state storage device, FIG. 12B is a side perspective view illustrating the solid-state storage device of FIG. 12A, and FIG. 12C is a cross-sectional perspective view illustrating the solid-state storage device of FIG. 12A, all according to embodiments. Storage device 1200 illustrates a combination of the cooling features described in more detail elsewhere herein. For example, storage device 1200 is depicted as comprising a cover 1202 over a base 1204 to which a PCB (see, e.g., PCB 210 of FIGS. 5B-5E) is mounted or in which a PCB is otherwise housed. A storage device (e.g., SSD) such as storage device 1200 may be implemented with the first inlet duct 202*d*-1, and associated first inlet port 202*p*-1 of cover 202 and first inlet port 204*p*-1 of base 204 (see, also e.g., FIGS. 2A-5E), and/or the second inlet duct 202*d*-2 such as over a PCB component 210-1 (see also, e.g., FIG. 5C), and associated second inlet port 202*p*-2 of cover 202 and second inlet port 204*p*-2 of base 204 (see also, e.g., FIGS. 2A-5E).

Furthermore, a storage device such as storage device 1200 may be implemented with the first and/or second row 603 of ventilation slots 603*a*-603*n*, 603*a*-603*m* of cover 602 (see, also e.g., FIGS. 6-7B), and/or the first and/or second row 605 of ventilation slots 605*a*-605*n*, 605*a*-605*m* of base 604 (see, also e.g., FIGS. 6, 8A-8B), positioned between first specification-restricted area 604*s*-1-1 and second specification-restricted area 604*s*-1-2 on one side and/or between first specification-restricted area 604*s*-2-1 and second specification-restricted area 604*s*-2-2 on the other side, and which are configured to direct airflow generally laterally over the outer side 6020 (see, e.g., FIGS. 6-7B) of the cover 602, 1202. According to an embodiment, storage device 1200 comprises an outer side of cover 1202 which further comprises a grouping or array of heatsink structures 1220 extending from a main body of cover 1202. Thus, directing the airflow across the outer side 6020 of the cover 1202 includes directing airflow through the ventilation slots 603*a*-603*n* and/or 603*a*-603*m* of cover 602 and the ventilation slots 605*a*-605*n* and/or 605*a*-605*m* of base 604 across the array of heatsink structures 1220 thereby enhancing or augmenting the storage device 1200 and corresponding PCB 210 cooling process.

Still further, a storage device such as storage device 1200 may be implemented with the first and/or second tooth structures 902*t*-1 with slits 902*s*-1, tooth structures 902*t*-2 with slits 902*s*-2 of the cover 1202 (see also, e.g., FIGS. 9A-10B), and the first and/or second tooth structures 904*t*-1 with slits 904*s*-1, tooth structures 904*t*-2 with slits 904*s*-2 of the base 1204 (see also, e.g., FIGS. 9A, 11A-11B), configured to enable cost effective end-to-end airflow through storage device 1200 while mitigating ESD risk.

Method of Assembling a Data Storage Device

FIG. 13 is a flow diagram illustrating a method of assembling a data storage device, according to an embodiment. For example, the method of FIG. 13 may be implemented to assemble a storage device 200 as exemplified in the illustrations and descriptions corresponding to FIGS. 2A-2B, a storage device 600 as exemplified in the illustrations and descriptions corresponding to FIG. 6, a storage device 900 as exemplified in the illustrations and descriptions corresponding to FIGS. 9A-9B, and a storage device 1200 as exemplified in the illustrations and descriptions corresponding to FIGS. 12A-12C.

At block 1302, couple a printed circuit board (PCB) to an enclosure base comprising (i) a first inlet port through a first lateral sidewall of the base and positioned between a first specification-restricted area of the first lateral sidewall of the base and a second specification-restricted area of the first lateral sidewall of the base, and (ii) at least one second inlet port through a second lateral sidewall of the base and positioned between a first specification-restricted area of the second lateral sidewall of the base and a second specification-restricted area of the second lateral sidewall of the base. For example, PCB 210 (FIGS. 5B-5E) is coupled to an enclosure base 204 (FIGS. 2A-2B, 4A-4B, 5B-5E), 604 (FIGS. 6, 8A-8B), 904 (FIGS. 9A-9B, 11A-11B), 1204 (FIGS. 12A-12B) comprising (i) a first inlet port 204*p*-1 (FIGS. 2A-2B, 4A-4B, 5B-5E) through a first lateral sidewall 204*s*-1 (FIGS. 2A-2B, 4A-4B, 5B-5E) of the base 204, 604, 904, 1204 and positioned between a first specification-restricted area 604*s*-1-1 (FIGS. 8A-8B) of the first lateral sidewall 604*s*-1 (FIGS. 8A-8B) of the base 604 and a second specification-restricted area 604*s*-1-2 (FIGS. 8A-8B) of the first lateral sidewall 604*s*-1 of the base 604, and (ii) at least one second inlet port 204*p*-2 (FIGS. 2A-2B, 4A-4B, 5B-5E) through a second lateral sidewall 204*s*-2 (FIGS. 2A-2B, 4A-4B, 5B-5E) of the base 204, 604, 904, 1204 and positioned between a first specification-restricted area 604*s*-2-1 (FIGS. 8A-8B) of the second lateral sidewall 604*s*-2 (FIGS. 8A-8B) of the base 204, 604, 904, 1204 and a second specification-restricted area 604*s*-2-2 (FIGS. 8A-8B) of the second lateral sidewall 604*s*-2 of the base 204, 604, 904, 1204.

At block 1304, couple to the base a cover covering the PCB, the cover comprising (i) a first inlet port through a first lateral sidewall of the cover and at least in part coincident with the first inlet port of the base, (ii) a first cooling duct at least in part coincident with the first inlet port of the cover, the first cooling duct configured to direct airflow laterally from the first inlet port of the cover to below the cover to the PCB, (iii) at least one second inlet port through a second lateral sidewall of the cover opposing the first lateral sidewall and at least in part coincident with the second inlet port of the base, and (iv) a second cooling duct at least in part coincident with the second inlet port of the cover, the second cooling duct configured to cover an electronic component extending from the PCB and to direct airflow laterally from the second inlet ports around the electronic component to below the cover to the PCB. For example, cover 202 (FIGS. 2A-2B, 3A-3D, 5B-5E), 604 (FIGS. 6, 7A-7B), 904 (FIGS. 9A-9B, 10A-10B), 1204 (FIGS. 12A-12B) is coupled to base 204, 604, 904, 1204 over the PCB 210, the cover 202, 602, 902, 1202 comprising (i) a first inlet port 202*p*-1 (FIGS. 2A-2B, 3A-3D, 5B-5E) through a first lateral sidewall 202*s*-1 (FIGS. 2A-2B, 3A-3D, 5B-5E) of the cover 202, 602, 902, 1202 and at least in part coincident with the first inlet port 204*p*-1 of the base 204, 604, 904, 1204, (ii) a first cooling duct 202*d*-1 (FIGS. 2A-2B, 3A-3D, 5B-5E) at least in part coincident with the first inlet port 202*p*-1 of the cover 202, 602, 902, 1202, the first cooling duct 202*d*-1 configured to direct airflow laterally from the first inlet port 202*p*-1 of the cover 202, 602, 902, 1202 to below the cover to the PCB 210, (iii) at least one second inlet port 202*p*-2 (FIGS. 2A-2B, 3A-3D, 5B-5E) through a second lateral sidewall 202*s*-2 (FIGS. 2A-2B, 3A-3D, 5B-5E) of the cover 202, 602, 902, 1202 opposing the first lateral sidewall 202*s*-1 and at least in part coincident with the second inlet port 204*p*-2 of the base 204, 604, 904, 1204, and (iv) a second cooling duct 202*d*-2 (FIGS. 2A-2B, 3A-3D, 5B-5E) at least in part coincident with the second inlet port 202*p*-2 of the cover 202, 602, 902, 1202, the second cooling duct 202*d*-2 configured to cover an electronic component 210-1 (FIG. 5C) extending from the PCB 210 and to direct airflow laterally from the second inlet port 202*p*-2 around the electronic component 210-1 to below the cover 202, 602, 902, 1202 to the PCB 210.

As described throughout herein, for a storage device such as an SSD, implementation of one or more cooling features described herein enables cost-effective (e.g., avoiding machining operations) enhanced airflow, ventilation, and cooling (e.g., using inlet ports and ducts and/or rows of ventilation slots for enabling lateral airflow to a PCB and/or over a cover/heatsinks) of such a device, within constraints that may be imposed by standard specifications to which the device may correspond (e.g., the grounding and riding surfaces required of the E3 family of specifications for SSDs), and while mitigating ESD risks associated with openings through ends (e.g., LED end, host connector end) of such a device.

Physical Description of an Illustrative Operating Context

Embodiments may be used in the context of electronic devices including digital data storage devices (DSDs), such as a solid-state drives (SSDs). Thus, FIG. 1 is a block diagram illustrating a generic SSD architecture 150, for an example operating context of an electronic device with which embodiments of the invention may be implemented. The generic SSD architecture 150 depicts an SSD 152 communicatively coupled with a host 154 through a primary communication interface 156. SSD implementations are not limited to a configuration as depicted in FIG. 1, as embodiments may be implemented with SSD configurations other than that illustrated in FIG. 1 and/or with electronic devices other than SSDs.

Host 154 broadly represents any type of computing hardware, software, or firmware (or any combination of the foregoing) that makes, among others, data I/O requests or calls to one or more memory device. For example, host 154 may be an operating system executing on a computer, a tablet, a mobile phone, or generally any type of computing device that contains or interacts with storage memory. The primary interface 156 coupling host 154 to SSD 152 may be, for example, a storage system's internal bus or a communication cable or a wireless communication link, or the like.

The example SSD 152 illustrated in FIG. 1 includes an interface 160, a controller 162 (e.g., a controller having firmware logic therein), an addressing 164 function block, data buffer cache 166, and one or more non-volatile memory (NVM) components 170*a*, 170*b*-170*n*, where n represents an arbitrary number of NVM components that may vary from implementation to implementation.

Interface 160 is a point of interaction between components, namely SSD 152 and host 154 in this context, and is applicable at the level of both hardware and software. This enables a component to communicate with other components via an input/output (IO) system and an associated protocol. A hardware interface is typically described by the mechanical, electrical and logical signals at the interface and the protocol for sequencing them. Some non-limiting examples of common and standard interfaces include SCSI (Small Computer System Interface), SAS (Serial Attached SCSI), and SATA (Serial ATA).

An SSD 152 includes a controller 162, which incorporates the electronics that bridge the non-volatile memory components (e.g., NAND flash) to the host, such as non-volatile memory 170*a*, 170*b*-170*n* to host 154. The controller is typically an embedded processor that executes firmware-level code and can be a significant factor in SSD performance.

Controller 162 interfaces with non-volatile memory 170*a*, 170*b*-170*n* via an addressing 164 function block. The addressing 164 function operates, for example, to manage mappings between logical block addresses (LBAs) from the host 154 to a corresponding physical block address on the SSD 152, namely, on the non-volatile memory 170*a*, 170*b*-170*n* of SSD 152. Because the non-volatile memory page and the host sectors are different sizes, an SSD has to build and maintain a data structure that enables it to translate between the host writing data to or reading data from a sector, and the physical non-volatile memory page on which that data is actually placed. This table structure or "mapping" may be built and maintained for a session in the SSD's volatile memory 172, such as DRAM or some other local volatile memory component accessible to controller 162 and addressing 164. Alternatively, the table structure may be maintained more persistently across sessions in the SSD's non-volatile memory such as non-volatile memory 170*a*, 170*b*-170*n*.

Addressing 164 interacts with data buffer cache 166, in addition to non-volatile memory 170*a*, 170*b*-170*n*. Data buffer cache 166 of an SSD 152 typically uses DRAM as a cache, similar to the cache in hard disk drives. Data buffer cache 166 serves as a buffer or staging area for the transmission of data to and from the non-volatile memory components, as well as serves as a cache for speeding up future requests for the cached data. Data buffer cache 166 is typically implemented with volatile memory so the data stored therein is not permanently stored in the cache, i.e., the data is not persistent.

Finally, SSD 152 includes the one or more non-volatile memory 170*a*, 170*b*-170*n* components. For a non-limiting example, the non-volatile memory components 170*a*, 170*b*-170*n* may be implemented as flash memory (e.g., NAND or NOR flash), or other types of solid-state memory available now or in the future. The non-volatile memory 170*a*, 170*b*-170*n* components are the actual memory electronic components on which data is persistently stored. The non-volatile memory 170*a*, 170*b*-170*n* components of SSD 152 can be considered the analogue to the hard disks in hard-disk drive (HDD) storage devices.

Furthermore, references herein to a data storage device may encompass a multi-medium storage device (or "multi-medium device", which may at times be referred to as a "multi-tier device" or "hybrid drive"). A multi-medium storage device refers generally to a storage device having functionality of both a traditional HDD (see, e.g., HDD 100) combined with an SSD (see, e.g., SSD 150) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A multi-medium storage device may be architected and configured to operate and to utilize the solid-state portion in a number of ways, such as, for non-limiting examples, by using the solid-state memory as cache memory, for storing frequently-accessed data, for storing I/O intensive data, for storing metadata corresponding to payload data (e.g., for assisting with decoding the payload data), and the like. Further, a multi-medium storage device may be architected and configured essentially as two storage devices in a single enclosure, i.e., a traditional HDD and an SSD, with either one or multiple interfaces for host connection.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A solid-state storage device, comprising:

a printed circuit board (PCB) comprising electronic means for non-volatile data storage;

an enclosure cover coupled to an enclosure base and covering the PCB, the enclosure cover comprising:

a first inlet port through a first lateral sidewall of the enclosure cover, a first cooling duct at least partially coincident with the first inlet port of the enclosure cover, the first cooling duct directing airflow laterally from the first inlet port of the enclosure cover to below the cover and to the PCB;

at least one second inlet port through a second lateral sidewall of the enclosure cover opposing the first lateral sidewall; and a second cooling duct at least partially coincident with the second inlet port of the enclosure cover, the second cooling duct covering an electronic component extending from the PCB and directing airflow laterally from the second inlet port of the enclosure cover around the electronic component to below the cover and to the PCB; and the enclosure base comprising:

a first inlet port through a first lateral sidewall of the enclosure base and substantially coincident with the first inlet port of the enclosure cover and positioned between a first specification-restricted area of the first lateral sidewall of the enclosure base and a second specification-restricted area of the first lateral sidewall of the enclosure base; and at least one second inlet port through a second lateral sidewall of the enclosure base and substantially coincident with the second inlet port of the enclosure cover and positioned between a first specification-restricted area of the second lateral sidewall of the enclosure base and a second specification-restricted area of the second lateral sidewall of the enclosure base.

2. The solid-state storage device of claim 1, wherein:

each of the first and second inlet ports of the enclosure cover is one of a row of ventilation slots, through the respective first and second lateral sidewall of the enclosure cover, and direct airflow over an outer side of the enclosure cover comprising extending heatsink structures; and each of the first and second inlet ports of the enclosure base is one of a row of ventilation slots, through the respective first and second lateral sidewall of the enclosure base, and direct airflow over the outer side of the enclosure cover.

3. The solid-state storage device of claim 1, wherein:

the enclosure base comprises:

a first series of tooth structures separated by slits through a first end wall of the enclosure base; and a second series of tooth structures separated by slits through a second end wall of the enclosure base opposing the first end wall of the enclosure base; and the enclosure cover comprises:

a first series of tooth structures separated by slits through a first end wall of the enclosure cover; and a second series of tooth structures separated by slits through a second end wall of the enclosure cover opposing the first end wall of the enclosure cover;

each tooth structure of the first and second series of tooth structures of the enclosure base mechanically interfaces with a corresponding tooth structure of the respective first and second series of tooth structures of the enclosure cover.

4. The solid-state storage device of claim 1, wherein the first specification-restricted area of the first lateral sidewall of the enclosure base comprises an electrical grounding surface area, and the second specification-restricted area of the first lateral sidewall of the enclosure base comprises a riding surface area for positioning of a device carrier associated with the solid-state storage device.

5. An electronic storage device, comprising:

an enclosure base comprising a first inlet port through a first lateral sidewall of the enclosure base;

a printed circuit board (PCB) coupled to the enclosure base; and an enclosure cover coupled to the enclosure base and covering the PCB, the enclosure cover comprising:

a first inlet port through a first lateral sidewall of the enclosure cover, the first inlet port of the enclosure cover substantially coincident with the first inlet port of the enclosure base; and a first cooling duct proximate to the first lateral sidewall of the enclosure cover and at least partially coincident with the first inlet port of the enclosure cover, the first cooling duct directing airflow laterally from the first inlet port of the enclosure cover to below the enclosure cover and to the PCB.

6. The electronic storage device of claim 5, wherein the first cooling duct directs airflow from the first inlet port of the enclosure cover to a target hot spot of the PCB.

7. The electronic storage device of claim 5, wherein:

the enclosure cover further comprises a row of ventilation slots through the first lateral sidewall of the enclosure cover, the row of ventilation slots directing airflow over an outer side of the enclosure cover; and the enclosure base comprises a row of ventilation slots through the first lateral sidewall of the enclosure base and substantially coincident with the ventilation slots of the enclosure cover and directing airflow over the outer side of the enclosure cover.

8. The electronic storage device of claim 7, wherein the outer side of the enclosure cover comprises a plurality of heatsink structures extending from a main body of the enclosure cover.

9. The electronic storage device of claim 5, wherein:

the enclosure cover further comprises:

a second inlet port through a second lateral sidewall of the enclosure cover, the second lateral sidewall opposing the first lateral sidewall; and a second cooling duct at least partially coincident with the second inlet port, the second cooling duct covering an electronic component extending from the PCB and directing airflow laterally from the second inlet port around the electronic component to below the cover and to the PCB.

10. The electronic storage device of claim 9, wherein the enclosure base comprises at least one second inlet port through a second lateral sidewall of the enclosure base, the second inlet port substantially coincident with the second inlet port of the enclosure cover.

11. The electronic storage device of claim 10, wherein:

the at least one second inlet port of the enclosure base is positioned between a first specification-restricted area of the second lateral sidewall of the enclosure base and a second specification-restricted area of the second lateral sidewall of the enclosure base; and the first inlet port through the first lateral sidewall of the enclosure base is positioned between a first specification-restricted area of the first lateral sidewall of the enclosure base and a second specification-restricted area of the first lateral sidewall of the enclosure base.

12. The electronic storage device of claim 9, wherein the enclosure base comprises a row of ventilation slots, through a second lateral sidewall of the enclosure base, the row of ventilation slots directing airflow over an outer side of the enclosure cover and positioned between a first specification-restricted area of the second lateral sidewall of the enclosure base and a second specification-restricted area of the second lateral sidewall of the enclosure base.

13. The electronic storage device of claim 5, wherein:

the enclosure base comprises a first series of tooth structures separated by slits through a first end wall of the enclosure base;

the enclosure cover comprises a first series of tooth structures separated by slits through a first end wall of the enclosure cover; and each tooth structure of the first series of tooth structures of the enclosure base mechanically interfaces with a corresponding tooth structure of the first series of tooth structures of the enclosure cover.

14. The electronic storage device of claim 13, wherein:

the enclosure base comprises a second series of tooth structures separated by slits through a second end wall of the enclosure base opposing the first end wall of the enclosure base;

the enclosure cover comprises a second series of tooth structures separated by slits through a second end wall of the enclosure cover opposing the first end wall of the enclosure cover; and each tooth structure of the second series of tooth structures of the enclosure base mechanically interfaces with a corresponding tooth structure of the second series of tooth structures of the enclosure cover.

15. The electronic storage device of claim 14, wherein:

each tooth structure of the first and second series of tooth structures of the enclosure base comprises a step structure that mechanically interfaces with the corresponding tooth structure of the first and second series of tooth structures of the enclosure cover; and each tooth structure of the first and second series of tooth structures of the enclosure cover comprises a step structure that mechanically interfaces with the corresponding tooth structure of the first and second series of tooth structures of the base.

16. The electronic storage device of claim 14, wherein:

the slits through the first end wall and the second end wall of the enclosure base are approximately 2 millimeters wide laterally; and the slits through the first end wall and the second end wall of the enclosure cover are approximately 2 millimeters wide laterally.

17. The electronic storage device of claim 5, wherein the first inlet port of the enclosure base comprises a chamfer feature.

18. The electronic storage device of claim 5, further comprising a thermal interface material disposed between the PCB and the enclosure cover.

19. A method of assembling a data storage device, comprising:

coupling a printed circuit board (PCB) to an enclosure base comprising:

a first inlet port through a first lateral sidewall of the enclosure base and positioned between a first specification-restricted area of the first lateral sidewall of the enclosure base and a second specification-restricted area of the first lateral sidewall of the enclosure base; and a second inlet port through a second lateral sidewall of the enclosure base and positioned between a first specification-restricted area of the second lateral sidewall of the enclosure base and a second specification-restricted area of the second lateral sidewall of the enclosure base; and coupling an enclosure cover to the enclosure base, the enclosure cover covering the PCB and comprising:

a first inlet port through a first lateral sidewall of the enclosure cover and at least partially coincident with the first inlet port of the enclosure base;

a first cooling duct at least partially coincident with the first inlet port of the enclosure cover, the first cooling duct directing airflow laterally from the first inlet port of the enclosure cover to below the enclosure cover and to the PCB;

a second inlet port through a second lateral sidewall of the enclosure cover opposite the first lateral sidewall and at least partially coincident with the second inlet port of the enclosure base; and a second cooling duct at least partially coincident with the second inlet port of the enclosure cover, the second cooling duct covering an electronic component extending from the PCB and directing airflow laterally from the second inlet ports, around the electronic component, and below the cover to the PCB.

20. The method of claim 19, wherein the first cooling duct directs airflow from the first inlet port of the enclosure cover to a target hot spot of the PCB.

* * * * *